US009190617B2

(12) United States Patent
Miwa et al.

(10) Patent No.: US 9,190,617 B2
(45) Date of Patent: Nov. 17, 2015

(54) PHOTOELECTRIC CONVERSION ELEMENT AND SOLAR CELL

(75) Inventors: Hideya Miwa, Tokyo (JP); Masahiko Kurachi, Tokyo (JP); Hidekazu Kawasaki, Tokyo (JP); Kazukuni Nishimura, Tokyo (JP)

(73) Assignee: KONICA MINOLTA BUSINESS TECHNOLOGIES, INC., Tokyo (JP)

( * ) Notice: Subject to any disclaimer, the term of this patent is extended or adjusted under 35 U.S.C. 154(b) by 411 days.

(21) Appl. No.: 13/557,459

(22) Filed: Jul. 25, 2012

(65) Prior Publication Data
US 2013/0025682 A1 Jan. 31, 2013

(30) Foreign Application Priority Data

Jul. 29, 2011 (JP) ................................. 2011-167017

(51) Int. Cl.
*H01L 51/42* (2006.01)
*H01L 51/46* (2006.01)
*H01L 51/00* (2006.01)

(52) U.S. Cl.
CPC ........ *H01L 51/0064* (2013.01); *H01L 51/0059* (2013.01); *H01L 51/4226* (2013.01); *Y02E 10/542* (2013.01); *Y02E 10/549* (2013.01)

(58) Field of Classification Search
CPC ............ H01L 51/0059; H01L 51/0061; H01L 51/0053; H01L 51/006; H01G 9/2004; H01G 9/2013; H01G 9/2031; H01G 9/2059; Y02E 10/542
USPC ........................................................ 136/263
See application file for complete search history.

(56) References Cited

U.S. PATENT DOCUMENTS

2008/0296564 A1* 12/2008 Nishimura et al. ............ 257/40
2012/0325319 A1* 12/2012 Nishimura et al. ........... 136/263

FOREIGN PATENT DOCUMENTS

JP 2000-106223 4/2000
JP 2000106223 A * 4/2000
(Continued)

OTHER PUBLICATIONS

C.W. Tang: Applied Physics Letters, 48 (2), p. 183-185 (1986).
(Continued)

*Primary Examiner* — James Lin
*Assistant Examiner* — Dujuan Horton
(74) *Attorney, Agent, or Firm* — Lucas & Mercanti, LLP

(57) ABSTRACT

An all solid-state dye sensitizing type photoelectric conversion element excellent in photoelectric conversion efficiency and stability of photoelectric conversion function due to the prevention of desorption of the dye, and a solar cell comprising the photoelectric conversion element are provided. The present invention relates to a photoelectric conversion element comprising a first electrode, a photoelectric conversion layer comprising a semiconductor and a sensitizing dye, and a solid hole transport layer, and a second electrode, on a substrate, wherein the sensitizing dye is represented by the general formula (1) and the solid hole transport layer comprises a polymer obtainable by polymerizing a compound represented by the following general formula (2) or a multimer of the compound.

General Formula (1)

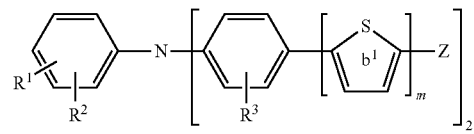

General Formula (2)

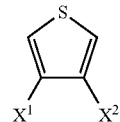

15 Claims, 1 Drawing Sheet

(56) References Cited

FOREIGN PATENT DOCUMENTS

| | | |
|---|---|---|
| JP | 2003-317814 | 11/2003 |
| JP | 2005-135656 | 5/2005 |
| JP | 2009016158 A * | 1/2009 |
| WO | 2004/082061 | 9/2004 |

OTHER PUBLICATIONS

G. Yu, J. Gao, J. C. Humelen, F. Wudl and A.J. Heeger: Science, vol. 270, p. 1789-1791 (1995).

U. Bach, D. Lupo, P. Comte, J.E. Moser, F. Weissortel, J. Salbeck, H. Spreitzer and M. Gratzel, Nature, vol. 395, p. 583-585 (1998).

G.R.A. Kumara, S. Kaneko, M. Okuya, A Konno and K. Tennakone: Key Engineering Materials, vol. 228 p. 119-124 (2002).

B. O'Regan and M. Gratzel: Nature, 353, 737 (1991).

J. Xia, N. Masaki, M. Lira-Cantu, Y. Kim, K. Jiang and S. Yanagida: Journal of the American Chemical Society, 130, 1258 (2008).

L. Groenendaal, G. Zotti and F. Joans, Synthetic Metals, 118, 105 (2001).

* cited by examiner

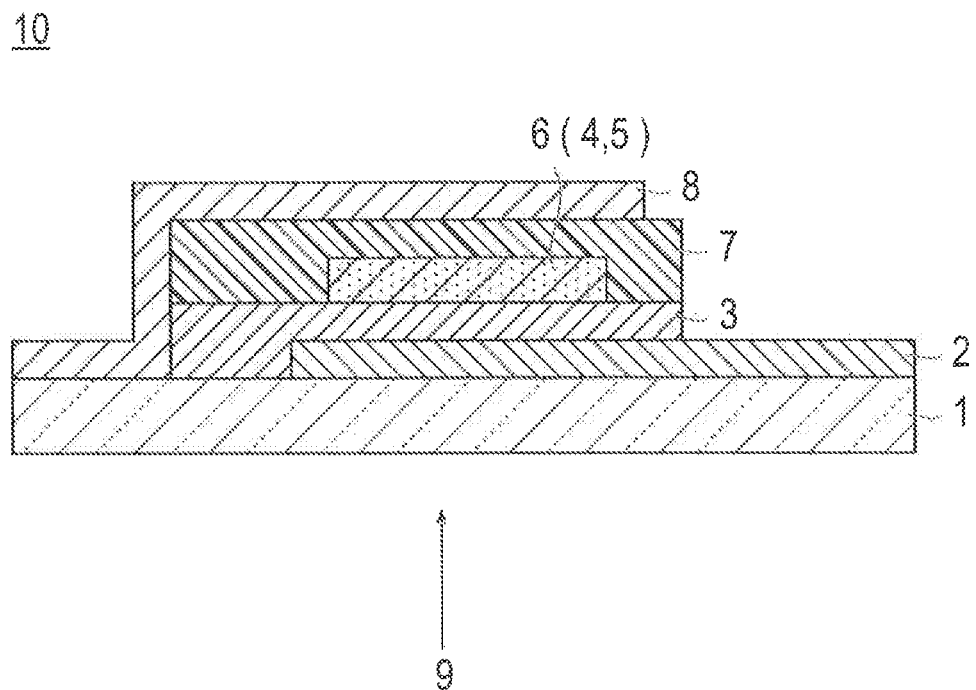

PHOTOELECTRIC CONVERSION ELEMENT AND SOLAR CELL

CROSS-REFERENCE TO RELATED APPLICATION

This application is based on Japanese Patent Application No. 2011-167017 filed on Jul. 29, 2011, the contents of which are incorporated herein by reference.

BACKGROUND

1. Technical Field

The present invention relates to a dye sensitizing type photoelectric conversion element and a solar cell that is constituted with the photoelectric conversion element.

2. Description of Related Arts

In recent years, solar light energy has drawn attention as an energy source because of environmental problems, and a method of converting light and heat by solar light energy into electric energy as a more usable energy form has been put into practical use. In particular, a method of converting the solar light energy into electric energy is typical, and a photoelectric conversion element is used in this method. For the photoelectric conversion element, a photoelectric conversion element using inorganic materials such as single crystal silicon, polycrystal silicon, amorphous silicon, cadmium telluride and copper indium selenide is widely used for, so-called, a solar cell. However, a solar cell obtained by using a photoelectric conversion element using these inorganic materials has a multiple layered pn junction structure in which a silicon, or the like used as a material is required to be a high purity product obtained by undergoing a high purification process, and thus, there has been problems such that production steps are complicated and the number of processes is large, and a production cost is high.

On the other hand, researches of a photoelectric conversion element using an organic material as a simpler element have progressed. For example, pn junction type organic photoelectric conversion element obtained by connecting a perylenetetracarboxylic acid derivative as an n-type organic dye and copper phthalocyanine as a p-type organic dye has been reported. In order to improve a short exciter diffusion length and a thin space charge layer, which are considered to be defective points in an organic photoelectric conversion element, an attempt to simply increase an area of pn junction portion to which organic thin films are laminated to ensure a sufficient number of organic dyes involved in charge separation has been achieving results.

Further, there has been a technique in which a pn conjunction portion is significantly increased by complexing an n-type electron conductive organic material and a p-type hole conductive polymer in a film to carry out charge separation in the entire film. Heeger, et al. suggested a photoelectric conversion element obtained by mixing a conjugate polymer as a p-type conductive polymer and fullerene as an electron conductive material in 1995.

These photoelectric conversion elements has gradually improved characteristics thereof but has not achieved operating stably with keeping high conversion efficiency.

However, in 1991, Gratzel performed huge and detailed experiments of a sensitizing photoelectric current of a dye adsorbed on titanium oxide, to succeed in preparation of a photoelectric conversion element that operates stably and has high conversion efficiency by forming titanium oxide into being porous, and sufficiently securing the charge separation area (the number of molecules contributing to charge separation) (for example, see B. O'Regan and M. Gratzel: Nature, 353, 737 (1991)).

In this photoelectric conversion element, a cycle in which a dye adsorbed on the surface of porous titanium oxide is photoexcited, electrons are injected into titanium oxide from the dye to form a dye cation, and the dye receives electrons through a hole transport layer from a counter electrode is repeated. For the hole transport layer, an electrolytic solution obtained by dissolving electrolyte containing iodine into an organic solvent has been used. This photoelectric conversion element has excellent reproducibility in cooperation with stability of titanium oxide, bases of research and development are largely extended. This photoelectric conversion element is also called a dye sensitizing type solar cell, which receives high expectation and attention. In this method, an inexpensive metal compound semiconductor such as titanium oxide is not required to be purified to high purity, an inexpensive one can be used as the semiconductor, further, available light ranges over the wide visible light region, and this method has an advantage such that the solar light having many visible light components can be effectively converted into electricity.

However, since a ruthenium complex having restriction as the resource is used for a photoelectric conversion layer, there are problems such that an expensive ruthenium complex is required to be used, stability with time is not sufficient, and the like. In addition, as a further problem, a dye sensitizing type solar cell operates using an electrolytic solution as described above and thus had a problem of requiring another mechanism to prevent retention, and effluence and dissipation of the electrolytic solution and iodine.

Development of an all solid-state dye sensitizing type solar cell that avoids such problems of elution of an electrolytic solution has been also progressing. For example, the all solid-state dye sensitizing type solar cell using an amorphous organic hole transport agent and the all solid-state dye sensitizing type solar cell using copper iodide as a hole transport agent have been known. Since conductivity of the hole transport agents is low, however, such cells have not yet attained sufficient photoelectric conversion efficiency.

Typical examples of a hole transport agent having comparatively high conductivity include polythiophene-based materials, and an all solid-state dye sensitizing type solar cell using polyethylene dioxythiophene (PEDOT) as a hole transport agent has been reported (for example, see JP-A-2003-317814 and J. Xia, N. Masaki, M. Lira-Cantu, Y. Kim, K. Jiang and S. Yanagida: Journal of the American Chemical Society, 130, 1258 (2008)). However, since PEDOT has absorption in the visible light region (400 to 700 nm), loss for light absorption of a dye is generated, and thus photoelectric conversion efficiency has not been sufficient yet.

On the other hand, it has been reported that when the PEDOT substituent described in L. Groenendaal, G. Zotti and F. Joans, Synthetic Metals, 118, 105 (2001) is used, absorbance in the visible light region is reduced while maintaining a conductivity, and an all solid-state dye sensitizing type solar cell using the PEDOT substituent as a hole transport agent has also been reported (for example, see JP-A No. 2000-106223).

On the other hand, development of an all solid-state dye sensitizing type solar cell using an organic dye in place of the ruthenium complex has also been progressing in order to reduce the cost of the solar cell. For example, the all solid-state dye sensitizing type solar cell using an organic methine dye having a thiophene backbone (WO 04/082061 A) has been reported and the all solid-state dye sensitizing type solar cell using an organic dye having a polythiophene backbone with a repetition number of 5 or more (JP-A-2005-135656) has been reported.

SUMMARY

The solid hole transport layer using the PEDOT or the PEDOT substituent is formed by applying energy such as electricity, light, and heat. In the photoelectric conversion element using the solid hole transport layer, when the organic dye described in WO 04/082061 A or JP-A-2005-135656 is used, the dye is desorbed by energy such as electricity, light, and heat which are used for forming the solid hole transport layer, which results in a reduction in conversion efficiency and a reduction in life-time. Particularly, this tendency is greater as the conductivity of the hole transport layer is higher. Thus, when the hole transport layer having high conductivity as described in JP-A-2000-106223 or L. Groenendaal, G. Zotti and F. Joans, Synthetic Metals, 118, 105 (2001) is used, it is difficult to use the low-cost organic dye described in WO 04/082061 A or JP-A-2005-135656.

The present invention has been made in view of the above problems, and an object thereof is to provide an all solid-state dye sensitizing type photoelectric conversion element and a solar cell excellent inphotoelectric conversion efficiency and stabilityof photoelectric conversion function in which the elution of the electrolyte is prevented by using a solid hole transport layer and the desorption of the dye is prevented.

The inventors of the present invention have performed intensive studies in order to improve the above problems: as a result, they have found out that the problems can be solved by combining an organic dye having a specific structure with a compound having a specific structure and have completed the present invention.

That is, the above object of the present invention is achieved by a photoelectric conversion element reflecting one aspect of the present invention comprising a first electrode, a photoelectric conversion layer comprising a semiconductor and a sensitizing dye, and a solid hole transport layer, and a second electrode, on a substrate, wherein the sensitizing dye is represented by the following general formula (1):

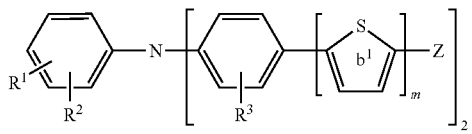

General Formula (1)

wherein $R^1$ and $R^2$ each independently represent a hydrogen atom, a halogen atom, an aromatic residue, a linear or branched hydrocarbon group having 1 to 32 carbon atoms, an alkenyl group having 2 to 32 carbon atoms, an alkynyl group having 2 to 32 carbon atoms, an alkoxy group having 1 to 32 carbon atoms or an alkylthio group having 1 to 32 carbon atoms, provided that $R^1$ and $R^2$ may bond with each other to form a ring structure;

$R^3$ represents a hydrogen atom, a halogen atom, a linear or branched alkyl group having 1 to 24 carbon atoms, an aryl group having 6 to 24 carbon atoms or an aralkyl group having 7 to 24 carbon atoms;

at least one of the hydrogen atoms in the ring $b^1$ may be substituted by a substituent, provided that a plurality of substituents may bond with each other to form a ring which may have a substituent, or a plurality of the rings $b^1$ may be condensed;

Z represents an organic residue having an acidic group, and an electron-attracting group or an organic residue having an electron-attracting ring structure;

m is an integer from 0 to 4, and when m is 2 or more, each ring may each independently have a substituent;

the solid hole transport layer comprises a polymer obtainable by polymerizing a compound represented by the following general formula (2) or a multimer of the compound;

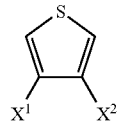

General formula (2)

wherein $X^1$ and $X^2$ each independently represent a hydrogen atom, a linear or branched alkyl group having 1 to 24 carbon atoms, an aryl group having 6 to 24 carbon atoms, —$OR^4$ group, —$SR^5$ group, —$SeR^6$ group or —$TeR^7$ group, $R^4$ to $R^7$ each independently represent a hydrogen atom or a linear or branched alkyl group having 1 to 24 carbon atoms, provided that $X^1$ and $X^2$ may bond with each other to form a ring structure.

BRIEF DESCRIPTION OF THE DRAWINGS

FIG. 1 is a schematic sectional view showing an embodiment of the photoelectric conversion element of the present invention. In the FIG. 1, symbol 1 stands for a substrate; 2 for a first electrode; 3 for a barrier layer; 4 for a sensitizing dye; 5 for a semiconductor; 6 for a photoelectric conversion layer; 7 for a hole transport layer; 8 for a second electrode; 9 for an incidence direction of solar light; and 10 for a photoelectric conversion element.

DETAILED DESCRIPTION

The present invention provides a photoelectric conversion element having a first electrode, a photoelectric conversion layer comprising a semiconductor and a sensitizing dye, a solid hole transport layer, and a second electrode, on a substrate, wherein the sensitizing dye is represented by the above general formula (1), the solid hole transport layer comprises a polymer obtainable by polymerizing a compound represented by the above general formula (2) or a multimer of the compound. The present invention has a feature in using a dye having the above specific structure as the sensitizing dye and using a polymer having a specific repeating unit in the solid hole transport layer. That is, adsorbability of the whole dye is improved by using a di-type dye having two acidic groups as a sensitizing dye. The desorption of the sensitizing dye is prevented by combining the improved dye and a solid hole transport layer comprising a polymer having a specific repeating unit. Thus, a photoelectric conversion element and a solar cell, which are excellent in photoelectric conversion efficiency and stability of photoelectric conversion functions, can be provided.

Hereinafter, the present invention will be specifically described.

(Photoelectric Conversion Element)

The photoelectric conversion element of the present invention is described with reference to FIG. 1.

FIG. 1 is a schematic sectional view showing an embodiment of the photoelectric conversion element of the present invention. As shown in FIG. 1, a photoelectric conversion element 10 is constituted with a substrate 1, a first electrode 2, a photoelectric conversion layer 6, a solid hole transport layer 7 and a second electrode 8, and a barrier layer 3. The photoelectric conversion layer 6 comprises a semiconductor 5 and a sensitizing dye 4. As shown in FIG. 1, the barrier layer 3 is preferably provided between the first electrode 2 and the photoelectric conversion layer 6 for the purpose of prevention of short circuit, sealing, and the like. Note that although the solar light enters from the direction of arrow 9 in the lower side in FIG. 1, the present invention is not limited to this embodiment and the solar light may enter from the upper side.

Then, a preferable embodiment of a method for producing the photoelectric conversion element of the present invention is shown below.

The barrier layer 3 is attached to be formed on the substrate 1 forming the first electrode 2 thereon. A semiconductor layer made of the semiconductor 5 is then formed on the barrier layer 3, and the sensitizing dye 4 is adsorbed to the surface of the semiconductor to form the photoelectric conversion layer 6. Then, the solid hole transport layer 7 is formed on the photoelectric conversion layer 6. Further, the solid hole transport layer 7 intrudes into the photoelectric conversion layer 6 made of the semiconductor 5 supporting the sensitizing dye 4 and is present thereon, and the second electrode 8 is formed on the solid hole transport layer 7. Electric current can be taken out by attaching terminals to the first electrode 2 and the second electrode 8.

Hereinafter, each members of the photoelectric conversion element of the present invention will be described.

(Substrate)

A substrate is provided in the side of the light incident direction, and from the viewpoint of photoelectric conversion efficiency of a photoelectric conversion element, the substrate has a light transmittance of preferably 10% or more, more preferably 50% or more, and particularly preferably 80% to 100%.

The light transmittance refers to a total light transmittance in visible light wavelength region measured in a method in accordance with "Plastics—Determination of the total luminous transmittance of transparent materials" of JIS K 7361-1:1997 (corresponding to ISO 13468-1:1996).

For the substrate, its materials, shape, structure, thickness, hardness, and the like can be suitably selected among known ones, and a substrate having high light permeability as described above is preferable.

Examples of the substrates include polyester resin films such as polyethylene terephthalate (PET), polyethylene naphthalate, and modified polyester, polyethylene (PE) resin films, polypropylene (PP) resin films, polystyrene resin films, polyolefin resin films such as cyclic olefin resin films, vinyl resin films such as poly(vinyl chloride) and poly(vinylidene chloride), polyvinylacetal resin films such as polyvinyl butyral (PVB), polyether ether ketone (PEEK) resin films, polysulfone (PSF) resin films, polyether sulfone (PES) resin films, polycarbonate (PC) resin films, polyamide resin films, polyimide resin films, acrylic resin films, and triacetyl cellulose (TAC) resin films. Among them, a resin film having a transmittance of 80% or more in a wavelength in visible light region (400 to 700 nm) can be particularly preferably used. From the viewpoint of transparency, heat resistance, easiness of handling, strength and cost, a substrate is more preferably a biaxial stretched polyethylene terephthalate film, a biaxially-oriented polyethylene naphthalate film, a polyether sulfone film, or a polycarbonate film, and still more preferably a biaxially-oriented polyethylene terephthalate film or a biaxially-oriented polyethylene naphthalate film. Other than these resin films, an inorganic glass film may be used as a substrate.

The substrate can be subjected to surface treatment or provided with a readily adhesive layer, in order to secure wetting property and adhesion property of a coating liquid.

Conventionally known techniques can be used for the surface treatment and the readily adhesive layer. Examples of the surface treatment include surface activation treatments such as a corona discharge treatment, flame treatment, ultraviolet treatment, high-frequency treatment, glow discharge treatment, active plasma treatment, and laser treatment.

Examples of the readily adhesive layer include those of a polyester, a polyamide, a polyurethane, a vinyl copolymer, a butadiene copolymer, an acrylic copolymer, a vinylidene copolymer, and an epoxy copolymer.

A thickness of a substrate is preferably 0.1 to 100 mm, and more preferably 0.5 to 10 mm.

(First Electrode)

The first electrode is arranged between the substrate and the photoelectric conversion layer. The first electrode is provided on the surface opposite to the light incident direction of the substrate. For the first electrode, one preferably having a light transmittance of 80% or more, and one more preferably having a light transmittance of 90% or more (upper limit: 100%) are used. The light transmittance is as defined in the explanation of the substrate mentioned above.

Materials forming the first electrode are not particularly limited, and known materials can be used. Examples thereof include metals such as platinum, gold, silver, copper, aluminum, rhodium, and indium; and metal oxides thereof such as $SnO_2$, CdO, ZnO, CTO-based ($CdSnO_3$, $Cd_2SnO_4$, $CdSnO_4$), $In_2O_3$, and $CdIn_2O_4$. Among these, silver is preferably used. A film having an opening which is subjected to grid patterning or a film obtained by dispersing and applying fine particles or nano-wires thereto is preferably used in order to impart light permeability. Preferable examples of the metal oxide include complex (doped) materials obtained by adding one or at least two selected from Sn, Sb, F and Al to the above metal oxides. Conductive metal oxides such as $In_2O_3$ doped with Sn (ITO), $SnO_2$ doped with Sb, and $SnO_2$ doped with F (FTO) are more preferably used, and from the viewpoint of heat resistance, FTO is the most preferable. A coating amount of a material forming the first electrode to the substrate is not particularly limited and is preferably about 1 to 100 g per 1 $m^2$ of the substrate.

A member having a first electrode formed on a substrate is also referred to as "a conductive support".

A film thickness of the conductive support is not particularly limited, and preferably within the range from 0.1 mm to 5 mm. The surface resistance of the conductive support is preferably 500 $\Omega/cm^2$ or less, and more preferably 10 $\Omega/cm^2$ or less. The lower limit of the surface resistance of the conductive support is preferably as low as possible and thus is not particularly necessarily prescribed, but 0.01 $\Omega/cm^2$ or more is sufficient. A preferable range of the light transmittance of the conductive support is the same as the preferable range of the light transmittance of the substrate described above.

(Photoelectric Conversion Layer)

The photoelectric conversion layer comprises a semiconductor and a sensitizing dye, and is made of a semiconductor layer comprising the sensitizing dye supported on the semiconductor.

(Sensitizing Dye)

The sensitizing dye to be used for the present invention is supported on a semiconductor by a sensitizing treatment of the semiconductor as described below, photoexcited at the time of light irradiation to be able to generate electromotive force, and is a compound represented by the following general formula (1):

General Formula (1)

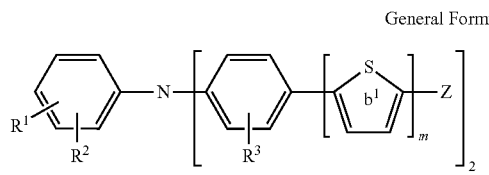

In the general formula (1), $R^1$ and $R^2$ each independently represent a hydrogen atom, a halogen atom, an aromatic residue, a linear or branched hydrocarbon group having 1 to 32 carbon atoms, an alkenyl group having 2 to 32 carbon atoms, an alkynyl group having 2 to 32 carbon atoms, an alkoxy group having 1 to 32 carbon atoms or an alkylthio group having 1 to 32 carbon atoms, provided that $R^1$ and $R^2$ may bond with each other to form a ring structure. $R^1$ and $R^2$ may be the same or different.

Aromatic residues represented by $R^1$ and $R^2$ are not particularly limited. The term "aromatic residue" means a group in which one hydrogen atom is removed from an aromatic ring such as an aromatic hydrocarbon ring, a heterocyclic aromatic ring, or a condensed aromatic ring. Examples thereof include an aryl group having 6 to 24 carbon atoms and a heteroaryl group having 2 to 24 carbon atoms.

The aryl group having 6 to 24 carbon atoms is not particularly limited. Examples include phenyl group, naphthyl group, biphenyl group, fluorenyl group, anthryl group, pyrenyl group, azulenyl group, acenaphthylenyl group, terphenyl group, and phenanthryl group. Among these groups, phenyl group, biphenyl group, and fluorenyl group are preferable, and phenyl group and fluorenyl group are more preferable.

The heteroaryl group having 2 to 24 carbon atoms is not particularly limited. Examples include pyrrolidinyl group, piperidinyl group, piperazinyl group, morpholino group, thiomorpholino group, homopiperidinyl group, chromanyl group, isochromanyl group, chromenyl group, pyrrolyl group, furanyl group, thienyl group, pyrazolyl group, imidazolyl group, furazanyl group, oxazolyl group, isoxazolyl group, thiazolyl group, isothiazolyl group, pyridyl group, pyridazinyl group, pyrimidinyl group, pyrazinyl group, pyranyl group, indolyl group, isoindolyl group, indazolyl group, purinyl group, indolizinyl group, quinolinyl group, isoquinolinyl group, quinazolinyl group, pteridinyl group, quinolizinyl group, benzoxazinyl group, carbazolyl group, phenazinyl group, phenothiazinyl group, and phenanthrolizinyl group. Among these groups, thienyl group and imidazolyl group are preferable, and imidazolyl group is more preferable.

The linear or branched hydrocarbon group having 1 to 32 carbon atoms for $R^1$ and $R^2$ is not particularly limited. Examples include a linear or branched alkyl group having 1 to 24 carbon atoms, a linear or branched alkenyl group of having 2 to 32 carbon atoms, a linear or branched alkynyl group having 2 to 24 carbon atoms, a cycloalkyl group having 3 to 9 carbon atoms, and a cycloalkenyl group having 3 to 9 carbon atoms. Among these, a linear or branched alkyl group having 1 to 18 carbon atoms and a cycloalkyl group having 3 to 7 carbon atoms are preferable, a linear alkyl group having 1 to 6 carbon atoms such as methyl group, ethyl group, n-propyl group, n-butyl group, n-pentyl group, and n-hexyl group, a branched alkyl group having 3 to 6 carbon atoms such as isopropyl group and t-butyl group, and a cycloalkyl group having 5 to 6 carbon atoms such as cyclopentyl group and cyclohexyl group are more preferable.

The linear or branched alkyl group having 1 to 24 carbon atoms is not particularly limited. Examples include methyl group, ethyl group, n-propyl group, isopropyl group, n-butyl group, isobutyl group, sec-butyl group, tert-butyl group, n-pentyl group, isopentyl group, tert-pentyl group, neopentyl group, 1,2-dimethylpropyl group, n-hexyl group, isohexyl group, 1,3-dimethylbutyl group, 1-isopropylpropyl group, 1,2-dimethylbutyl group, n-heptyl group, 1,4-dimethylpentyl group, 3-ethylpentyl group, 2-methyl-1-isopropylpropyl group, 1-ethyl-3-methylbutyl group, n-octyl group, 2-ethylhexyl group, 3-methyl-1-isopropylbutyl group, 2-methyl-1-isopropyl group, 1-t-butyl-2-methylpropyl group, n-nonyl group, 3,5,5-trimethylhexyl group, n-decyl group, isodecyl group, n-undecyl group, 1-methyldecyl group, n-dodecyl group, n-tridecyl group, n-tetradecyl group, n-pentadecyl group, n-hexadecyl group, n-heptadecyl group, n-octadecyl group, n-nonadecyl group, n-eicosyl group, n-heneicosyl group, n-docosyl group, n-tricosyl group, and n-tetracosyl group.

The linear or branched alkenyl group having 2 to 32 carbon atoms is not particularly limited. Examples include vinyl group, 1-propenyl group, 2-propenyl group, isopropenyl group, 1-butenyl group, 2-butenyl group, 3-butenyl group, 1-pentenyl group, 2-pentenyl group, 3-pentenyl group, 1-hexenyl group, 2-hexenyl group, 3-hexenyl group, 1-heptenyl group, 2-heptenyl group, 5-heptenyl group, 1-octenyl group, 3-octenyl group, and 5-octenyl group.

The linear or branched alkynyl group having 2 to 24 carbon atoms is not particularly limited. Examples include acetylenyl group, 1-propynyl group, 2-propynyl group, 1-butynyl group, 2-butynyl group, 3-butynyl group, 1-pentynyl group, 2-pentynyl group, 3-pentynyl group, 1-hexynil group, 2-hexynil group, 3-hexynil group, 1-heptynyl group, 2-heptynyl group, 5-heptynyl group, 1-octynyl group, 3-octynyl group, and 5-octynyl group.

The alkoxy group having 1 to 32 carbon atoms for $R^1$ and $R^2$ is not particularly limited. Examples include methoxy group, ethoxy group, propoxy group, isopropoxy group, butoxy group, pentyloxy group, hexyloxy group, 2-ethylhexyloxy group, octyloxy group, nonyloxy group, decyloxy group, undecyloxy group, dodecyloxy group, tridecyloxy group, tetradecyloxy group, pentadecyloxy group, hexadecyloxy group, heptadecyloxy group, and octadecyloxy group. Among these groups, an alkoxy group having 4 to 32 carbon atoms is preferable, and an octadecyloxy group is more preferable.

Particularly, $R^1$ and $R^2$ are preferably a linear or branched alkyl group having 2 to 24 carbon atoms, a linear or branched aryl group having 7 to 24 carbon atoms, an alkoxy group having 1 to 32 carbon atoms or a linear or branched alkenyl group having 2 to 32 carbon atoms.

In a still more preferable embodiment, $R^1$ represents a linear alkyl group having 6 to 18 carbon atoms, and $R^2$ represents a hydrogen atom. When the sensitizing dye has an alkyl group with a long chain, it is presumed that self-cohesion is prevented by the alkyl group and durability can be thus improved.

In another still more preferable embodiment, $R^1$ represents a linear alkenyl group having 2 to 32 carbon atoms, and $R^2$ represents a hydrogen atom. Particularly, a group having a structure in which the hydrogen atom in the alkenyl group of $R^1$ is substituted by an aryl group is preferable. In the case of such a structure, it is presumed that the smoothness of the sensitizing dye is improved, and thus durability can be improved.

$R^1$ and $R^2$ may bond with each other to form a ring structure as described above. For example, it is preferable that the compound represented by the following general formula (3) is used as a sensitizing dye. In the case of such a structure, the smoothness of the sensitizing dye is improved, and thus durability can be improved.

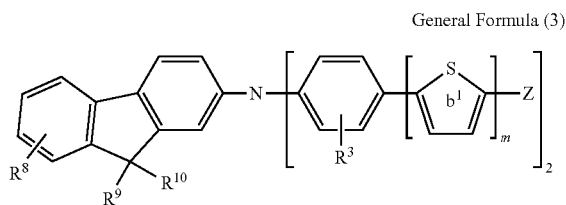

General Formula (3)

In the general formula (3), $R^8$ represents a hydrogen atom, a linear or branched alkyl group having 1 to 24 carbon atoms, an aryl group having 6 to 24 carbon atoms, an aralkyl group having 7 to 24 carbon atoms, an alkoxy group having 1 to 18 carbon atoms or a halogen atom. $R^9$ and $R^{10}$ each independently represent a hydrogen atom, a halogen atom, a linear or branched alkyl group having 1 to 24 carbon atoms, an alkenyl group having 2 to 24 carbon atoms or an aryl group having 6 to 24 carbon atoms.

The linear or branched alkyl group having 1 to 24 carbon atoms, aryl group having 6 to 24 carbon atoms, and alkoxy group having 1 to 18 carbon atoms for $R^8$ are not particularly limited, and can be specifically the same as the alkyl group, aryl group, and alkoxy group in the above general formula (1).

The aralkyl group having 7 to 24 carbon atoms for $R^8$ is not particularly limited. The term "aralkyl group" means an alkyl group substituted by at least one aryl group. As these alkyl and aryl groups, groups the same as the alkyl group and aryl group in the above general formula (1) can be used. Examples include benzyl group (i.e., phenylmethyl group) and 2-phenyl group.

The halogen atom for $R^8$ is not particularly limited, and can be any of a fluorine atom, a chlorine atom, a bromine atom, and an iodine atom.

Among them, $R^8$ is preferably a linear alkyl group having 6 to 24 carbon atoms or an alkoxy group having 6 to 24 carbon atoms, more preferably an alkoxy group having 6 to 24 carbon atoms. When the sensitizing dye has an alkyl group with a long chain or an alkoxy group with a long chain, it is presumed that self-cohesion is prevented and durability can be thus improved.

The linear or branched alkyl group having 1 to 24 carbon atoms and aryl group having 6 to 24 carbon atoms for $R^9$ and $R^{10}$ are not particularly limited, and can be specifically the same as the alkyl group and aryl group in the above general formula (1).

The halogen atom for $R^9$ and $R^{10}$ is not particularly limited, and can be any of a fluorine atom, a chlorine atom, a bromine atom, and an iodine atom.

In the above general formula (1) or the general formula (3), $R^3$ represents a hydrogen atom, a halogen atom, a linear or branched alkyl group having 1 to 24 carbon atoms, an aryl group having 6 to 24 carbon atoms or an aralkyl group having 7 to 24 carbon atoms. The halogen atom, linear or branched alkyl group having 1 to 24 carbon atoms, aryl group having 6 to 24 carbon atoms and aralkyl group having 7 to 24 carbon atoms for $R^3$ are not particularly limited, and can be the same as those exemplified by $R^1$, $R^2$, and $R^8$. Preferably, $R^3$ represents hydrogen atom or methyl group.

In the above general formula (1) or the general formula (3), m is an integer from 0 to 4, preferably an integer from 1 to 4, more preferably an integer from 2 to 4, particularly preferably from 2 to 3. When m is 1 or more, at least one of the hydrogen atoms in the ring $b^1$ may be substituted by a substituent, provided that a plurality of substituents may bond with each other to form a ring which may have a substituent. Further, when m is 2 or more, each ring may each independently have a substituent and/or a plurality of the rings $b^1$ may be fused. In particular, it is particularly preferable that at least one ring $b^1$ has a linear alkyl group having 6 to 24 carbon atoms as a substituent in terms of improving efficiency while providing solubility in a solution form and having an inhibitory effect on excessive cohesion when adsorbing on the surface of semiconductor.

In $R^1$, $R^2$, $R^8$, $R^9$, and $R^{10}$, at least one of hydrogen atoms in the "aromatic residue", "linear or branched hydrocarbon group having 1 to 32 carbon atoms", "alkenyl group having 2 to 32 carbon atoms", "alkynyl group having 2 to 32 carbon atoms", "alkoxy group having 1 to 32 carbon atoms", "alkylthio group having 1 to 32 carbon atoms", "linear or branched alkyl group having 1 to 24 carbon atoms", "aryl group having 6 to 24 carbon atoms", "aralkyl group having 7 to 24 carbon atoms", and "alkoxy group having 1 to 18 carbon atoms" can be substituted by a substituent.

In $R^1$, $R^2$, $R^8$, $R^9$, $R^{10}$, and $b^1$, substituents are selected from the group consisting of a halogen atom, each substituted or non-substituted linear or branched, alkyl group having 1 to 24 carbon atoms, a hydroxyalkyl group having 1 to 18 carbon atoms, an alkoxy group having 1 to 18 carbon atoms, an acyl group having 1 to 32 carbon atoms, an aryl group having 6 to 24 carbon atoms, an alkenyl group having 2 to 32 carbon atoms, an amino group, and a heteroaryl group having 2 to 24 carbon atoms.

The halogen atom, linear or branched alkyl group having 1 to 24 carbon atoms, alkoxy group having 1 to 18 carbon atoms, aryl group having 6 to 24 carbon atoms, alkenyl group having 2 to 32 carbon atoms, and heteroaryl group having 2 to 24 carbon atoms as the substituents for $R^1$, $R^2$, $R^8$, $R^9$, $R^{10}$, and $b^1$ are not particularly limited, and can be the same as those exemplified by $R^1$, $R^2$, $R^8$, and $b^1$.

The hydroxyalkyl group having 1 to 18 carbon atoms as the substituents for $R^1$, $R^2$, $R^8$, $R^9$, $R^{10}$, and $b^1$ is not particularly limited. Examples include hydroxymethyl group and hydroxyethyl group.

The acyl group having 1 to 32 carbon atoms as the substituents for $R^1$, $R^2$, $R^8$, $R^9$, $R^{10}$, and $b^1$ is particularly not limited. Examples include formyl group, acetyl group, propionyl group, butyryl group, isobutyryl group, valeryl group, isovaleryl group, 2-methylvaleryl group, 3-methylvaleryl group, 4-methylvaleryl group, t-butylacetyl group, pivaloyl group, caproyl group, 2-ethylhexanoyl group, 2-methylhexanoyl group, heptanoyl group, octanoyl group, and benzoyl group. Among these, an acyl group having 1 to 32 carbon atoms is preferable, and benzoyl group is more preferable.

The substituents for $R^1$, $R^2$, $R^8$, $R^9$, $R^{10}$, and $b^1$ are preferably a linear alkyl group having 6 to 18 carbon atoms, an aryl group having 6 to 24 carbon atoms or an alkoxy group having 6 to 18 carbon atoms, more preferably n-octyl group, phenyl group, n-hexyloxy group or n-octyloxy group.

In the above general formula (1) or the general formula (3), Z represents an organic residue having an acidic group, and an electron-attracting group or an organic residue having an electron-attracting ring structure.

Examples of the acidic group in Z include carboxyl group, sulfo group [—SO$_3$H], sulfino group, sulfinyl group, phosphonic acid group [—PO(OH)$_2$], phosphoryl group, phosphinyl group, phosphono group, thiol group, hydroxy group, phosphonyl group, and sulfonyl group; and salts thereof. Among these, for the acidic group, carboxyl group, sulfo group, phosphonic acid group, and hydroxy group are preferable, and carboxyl group, sulfo group, and phosphonic acid group are more preferable.

Examples of the electron-attracting group in Z include cyano group, nitro group, fluoro group, chloro group, bromo group, iode group, a perfluoroalkyl group (for example, trifluoromethyl group), an alkylsulfonyl group, an arylsulfonyl group, a perfluoroalkylsulfonyl group, and a perfluoroaryl sulfonyl group. Among these, cyano group, nitro group, chloro group, and fluoro group are preferable, and cyano group and nitro group are more preferable.

Examples of the electron-attracting ring structure in Z include rhodanine ring, dirhodanine ring, imidazolone ring, pyrazolone ring, pyrazoline ring, quinone ring, pyran ring, pyrazine ring, pyrimidine ring, imidazole ring, indole ring, benzothiazole ring, benzoimidazole ring, and benzooxazole ring. Among these, rhodanine ring, dirhodanine ring, imidazolone ring, pyrazoline ring, thiadiazole ring, and quinone ring are preferable, and rhodanine ring, dirhodanine ring, imidazolone ring, and pyrazoline ring are more preferable.

These for Z can effectively inject photoelectrons into a semiconductor (particularly, an oxide semiconductor).

It is preferable that Z has cyano group and carboxylic acid. When it has a cyano group and carboxylic acid, adsorbability is improved and the desorption of the dye can be effectively prevented. That is, in one embodiment of the present invention, Z in the general formula (1) or the general formula (3) has the following structure:

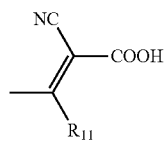

In the above structure, $R^{11}$ represents a hydrogen atom, a halogen atom, a linear or branched alkyl group having 1 to 24 carbon atoms, an aryl group having 6 to 24 carbon atoms, an aralkyl group having 7 to 24 carbon atoms, an alkoxy group having 1 to 18 carbon atoms or a cyano group. A halogen atom, an alkyl group having 1 to 24 carbon atoms, an aryl group having 6 to 24 carbon atoms, an aralkyl group having 7 to 24 carbon atoms, and an alkoxy group having 1 to 18 carbon atoms can be the same as those groups exemplified in the general formula (1) or the general formula (3). $R^{11}$ is preferably hydrogen atom or methyl group.

In Z, it is preferable that an acidic group is connected with an electron-attracting group or an electron-attracting ring structure through an amide bond. When the amide bond is contained, adsorbability is improved and the desorption of the dye can be effectively prevented.

That is, in one embodiment of the present invention, Z in the general formula (1) or the general formula (3) has the following structure:

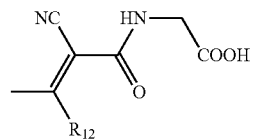

In the above structure, $R^{12}$ represents a hydrogen atom, a halogen atom, a linear or branched alkyl group having 1 to 24 carbon atoms, an aryl group having 6 to 24 carbon atoms, an aralkyl group having 7 to 24 carbon atoms, an alkoxy group having 1 to 18 carbon atoms or cyano group. A halogen atom, an alkyl group having 1 to 24 carbon atoms, an aryl group having 6 to 24 carbon atoms, an aralkyl group having 7 to 24 carbon atoms, and an alkoxy group having 1 to 18 carbon atoms can be the same as those groups exemplified in the general formula (1) or the general formula (3). $R^{12}$ is preferably hydrogen atom or methyl group.

In Z, an acidic group may be connected with an electron-attracting group or an electron-attracting ring structure through an aromatic residue which may have a substituent, a linear or branched hydrocarbon group having 1 to 32 carbon atoms which may have a substituent, or an atom such as an oxygen atom (O), a sulfur atom (S), a selenium atom (Se), or a tellurium atom (Te). Alternatively, Z may be charged, particularly positively charged, and in this time, Z may have a counter ion such as Br$^-$, I$^-$, ClO$_4^-$, OH$^-$, and Cl$^-$. The aromatic residue which may have a substituent and the linear or branched hydrocarbon group having 1 to 32 carbon atoms which may have a substituent can be the same as those described above.

That is, preferable examples of Z include the following:

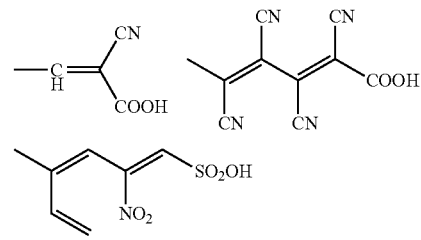

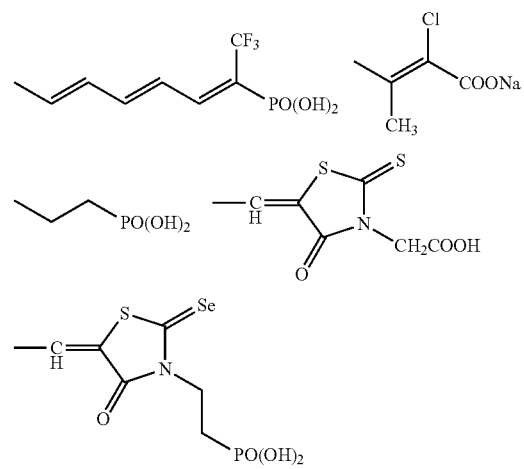

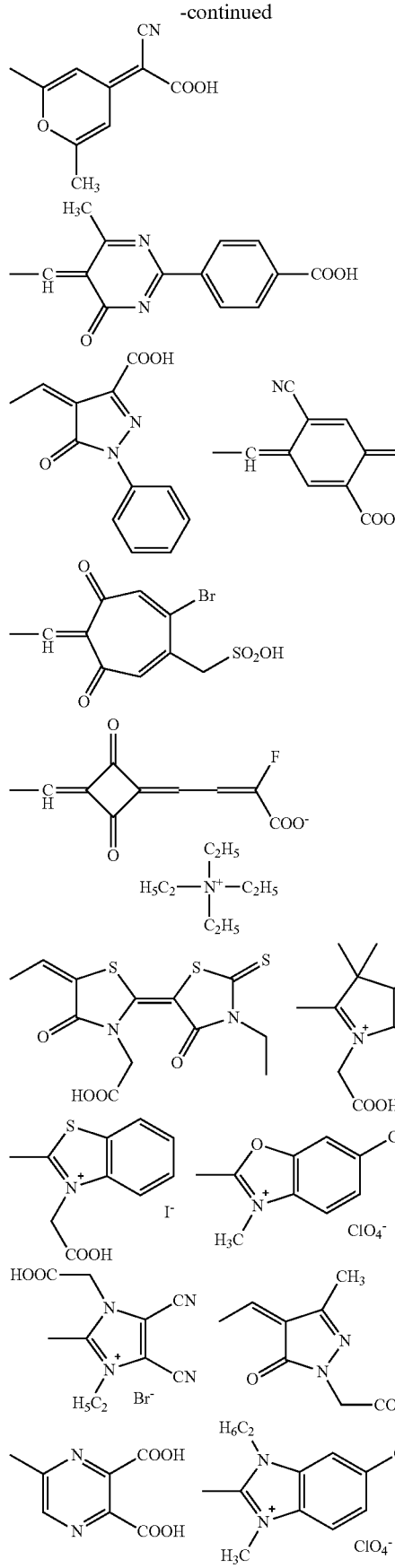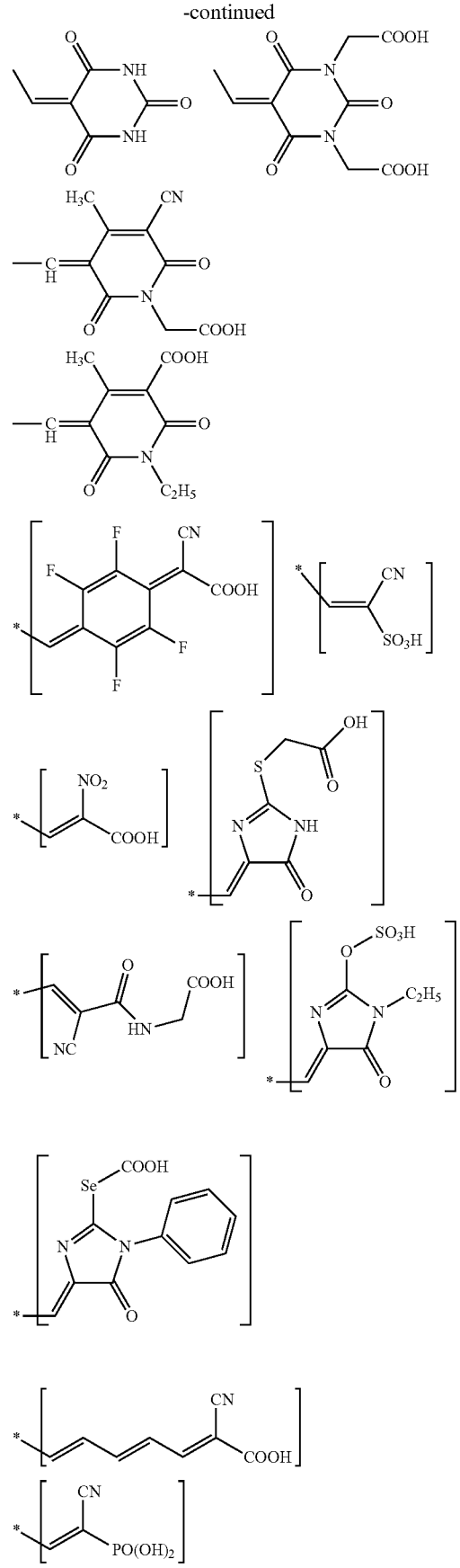

-continued
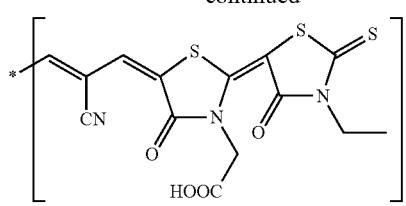
Particularly preferable examples of the sensitizing dye according to the present invention will be shown below. In addition, the sensitizing dyes are prescribed as the following symbol in examples described below.
D-1
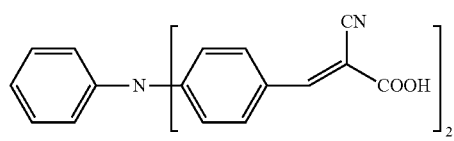
D-2
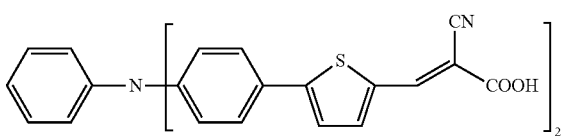
D-3
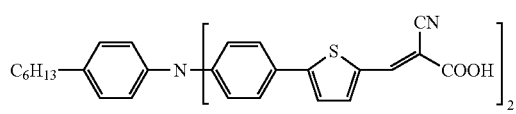
D-4
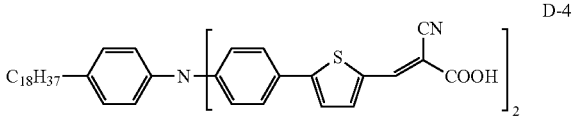
D-5
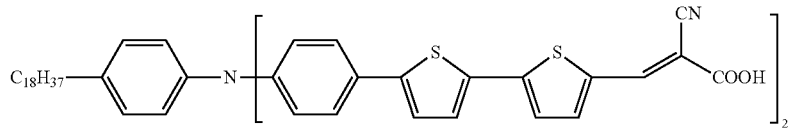
D-6
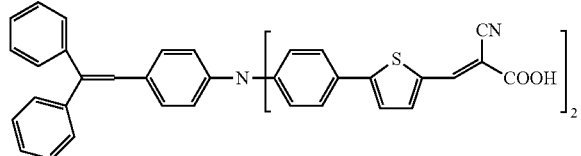
D-7
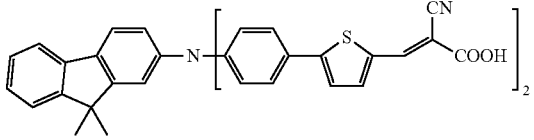
D-8
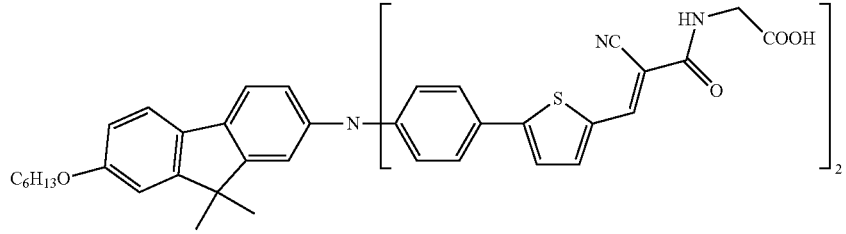
D-9
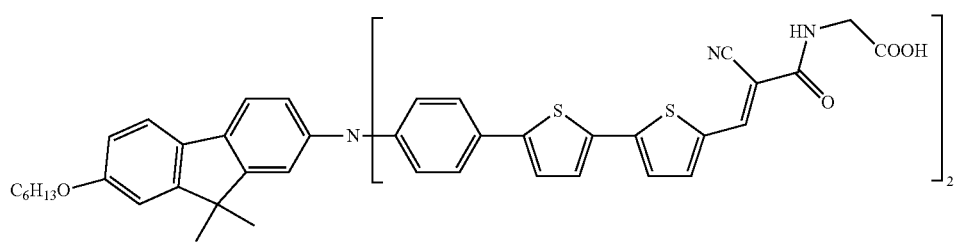

-continued
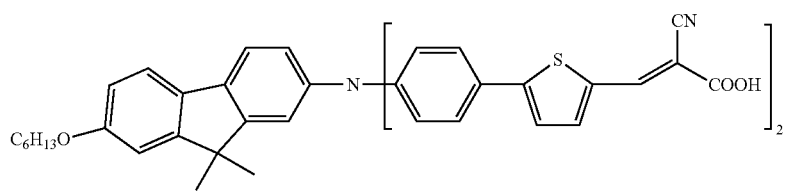
D-10
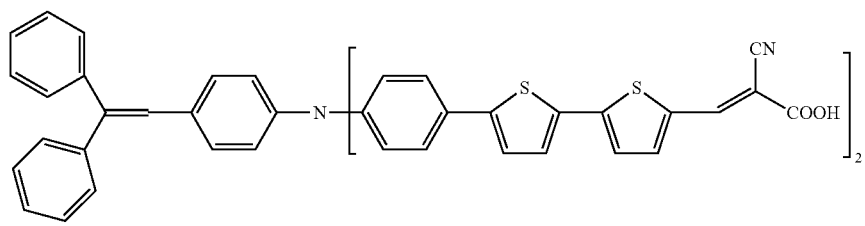
D-11
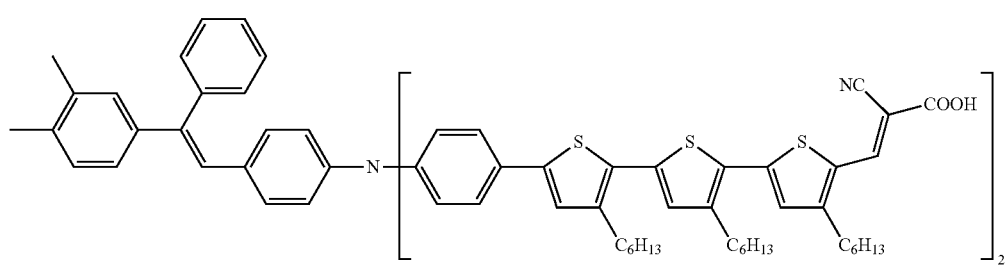
D-12
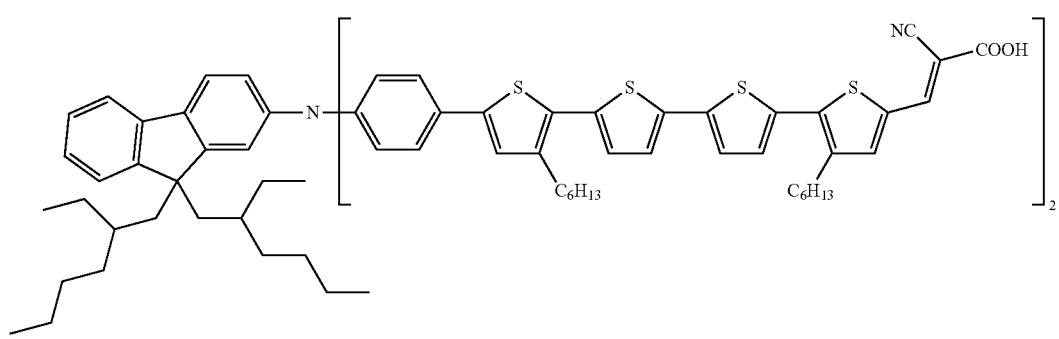
D-13
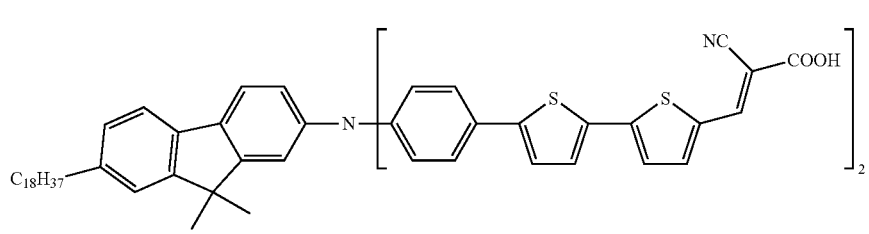
D-14
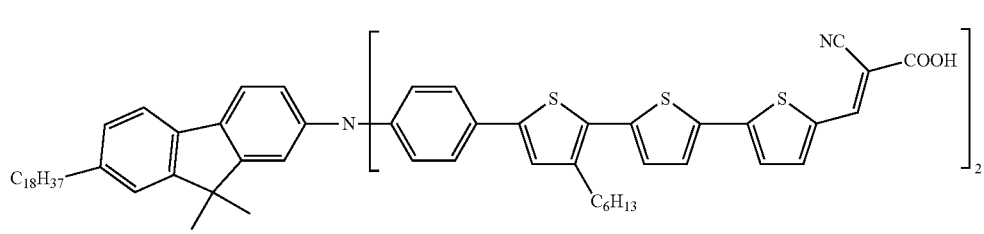
D-15

-continued

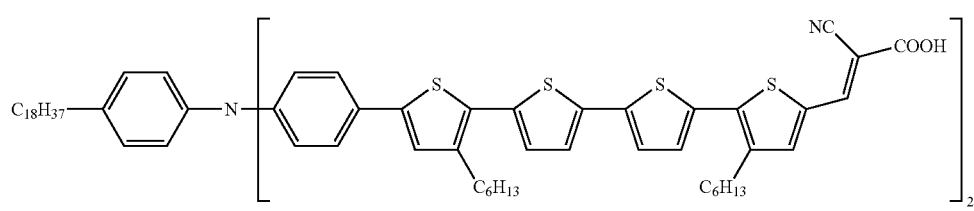
D-16

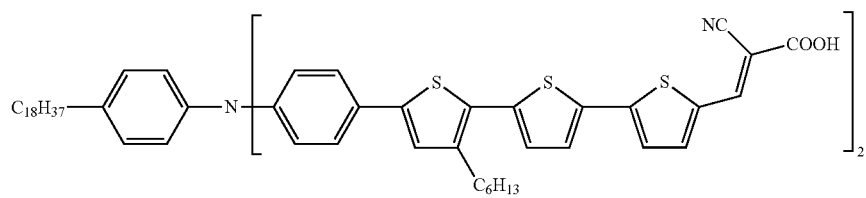
D-17

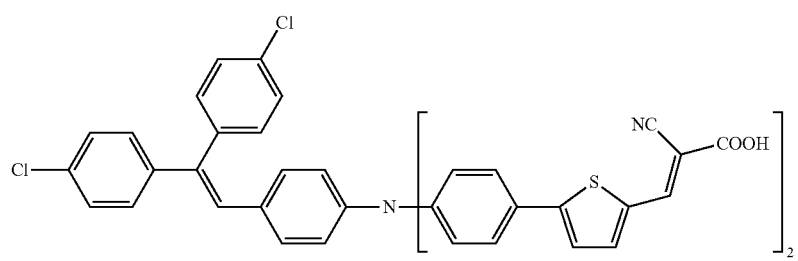
D-18

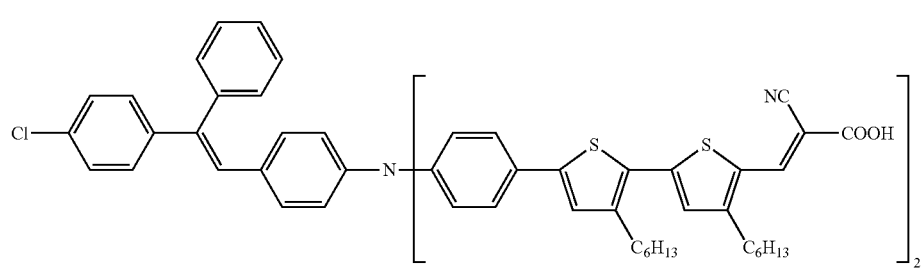
D-19

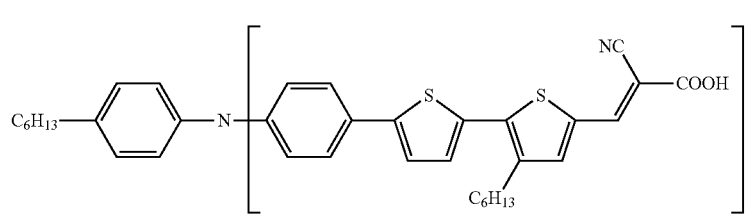
D-20

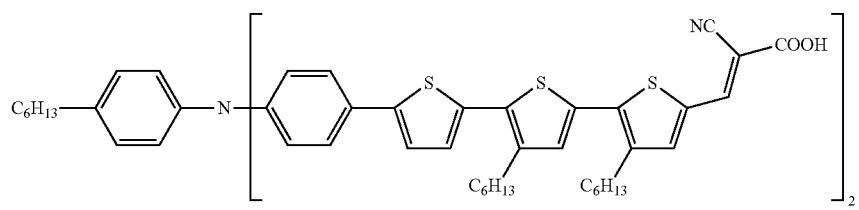
D-21

A method for synthesizing the compound represented by the above general formula (1) is not particularly limited.

For example, the compound can be synthesized by the method described in JP-A-2009-9931 or the method which is appropriately modified.

Hereinafter, a preferable embodiment of a method for producing, for example, the above compounds (D-1) and (D-7) will be described. Note that the present invention is not limited to the following preferable embodiment and other similar methods and other known methods can be applied.

[Synthesis of Compound (D-1)]

9 eq of phosphorus oxychloride and 12 eq of N,N-dimethylformamide are added to triphenylamine. Under a nitrogen atmosphere, the mixture is heated at 60° C. for 8 hours to prepare a diformyl body. Then, an acetic acid solution of the diformyl body, 3.6 eq of cyanoacetic acid, and 6.6 eq of ammonium acetate is heated to reflux for 1 hour to prepare a compound (D-1).

[Synthesis of Compound (D-7)]

The compound (D-7) is obtained according to the following scheme.

or $Nb_2O_5$ is more preferably used, and $TiO_2$ (titanium oxide) is particularly preferably used.

The semiconductor used for the semiconductor layer may be used solely or two or more semiconductors may be used in combination. For example, one or a combination of several kinds of the above metal oxides or metal sulfides may be used,

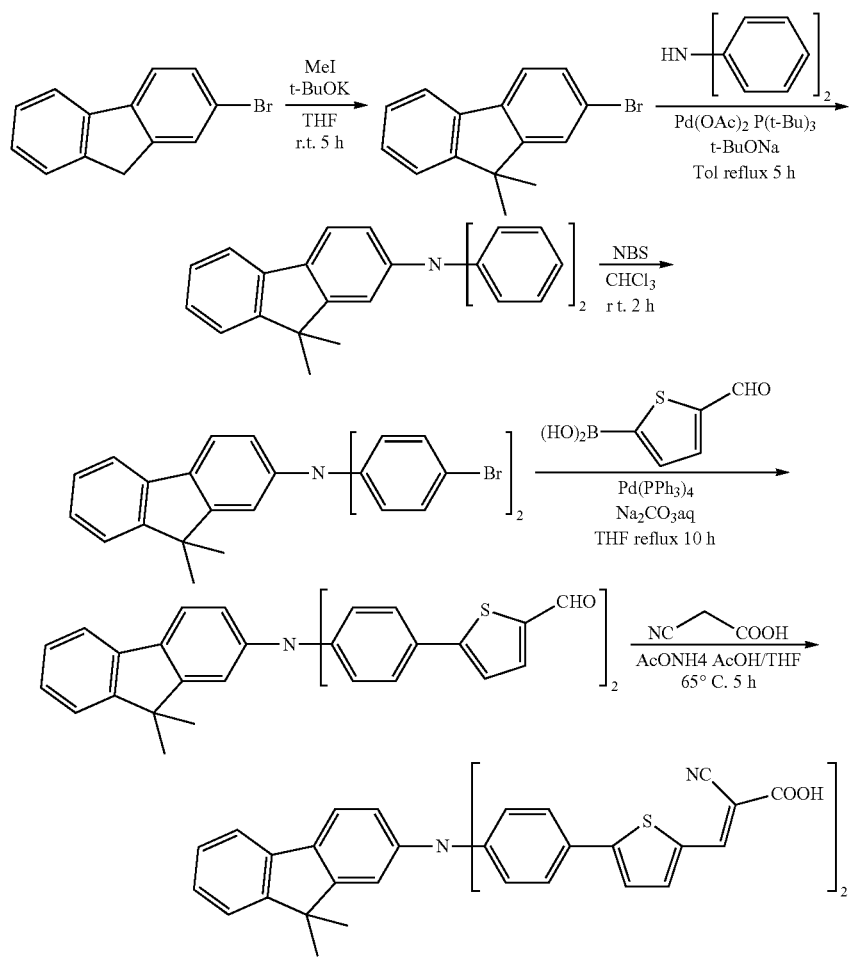

(Semiconductor)

For a semiconductor used for the semiconductor layer, examples including elemental substances such as silicon and germanium, compounds having elements from the group 3 to the group 5 and the group 13 to the group 15 in the periodic table (also referred to as periodic table of the elements), metal chalcogenides (for example, oxides, sulfides, and selenides), and metal nitrides can be used. Examples of preferable metal chalcogenide include oxides of titanium, tin, zinc, iron, tungsten, zirconium, hafnium, strontium, indium, cerium, yttrium, lanthanum, vanadium, niobium or tantalum, sulfides of cadmium, zinc, lead, silver, antimony or bismuth, selenides of cadmium or lead, and tellurides of cadmium. Examples of other compounds for the semiconductor include phosphide of zinc, gallium, indium, or cadmium, selenides of gallium-arsenic or copper-indium, sulfide of copper-indium, and nitride of titanium.

Specific examples include $TiO_2$, $SnO_2$, $Fe_2O_3$, $WO_3$, $ZnO$, $Nb_2O_5$, CdS, ZnS, PbS, $Bi_2S_3$, CdSe, CdTe, GaP, InP, GaAs, $CuInS_2$, $CuInSe_2$, and $Ti_3N_4$. Among them, $TiO_2$, ZnO, $SnO_2$, $Fe_2O_3$, $WO_3$, $Nb_2O_5$, CdS and PbS are preferably used, $TiO_2$ and a titanium oxide semiconductor mixed with 20% by weight of titanium nitride ($Ti_3N_4$) may also be used. Alternatively, a form of a zinc oxide/tin oxide complex, as described in J. Chem. Soc. Chem. Commun., 15 (1999), may be used for the semiconductor. In this case, when a component other than a metal oxide or a metal sulfide is added for the semiconductor, a weight ratio of the component added to the metal oxide or metal sulfide semiconductor is preferably 30% or less.

A shape of a semiconductor used for the semiconductor layer is not particularly limited, and the semiconductor may have any shape of a spherical shape, a columnar shape, a tubular shape, or the like. A size of a semiconductor used for the semiconductor layer is also not particularly limited. For example, an average particle diameter of a semiconductor in the case that the semiconductor used for the semiconductor layer is spherical is preferably 1 to 5000 nm, and more preferably 2 to 100 nm. "The average particle diameter" of the semiconductor used for the semiconductor layer is referred to as an average particle diameter of primary particle diameters (average primary particle diameter) when 100 or more samples are observed with an electron microscope.

The semiconductor according to the present invention may be subjected to a surface treatment using an organic base. Examples of the organic base include diarylamine, triarylamine, pyridine, 4-t-butyl pyridine, polyvinyl pyridine, quinoline, piperidine, and amidine, and among them, pyridine, 4-t-butyl pyridine, and polyvinyl pyridine are preferable. The surface treatment method of a semiconductor in this time is not particularly limited, and known methods can be used directly or suitably modified to be applied. For example, the organic base can be used directly in the case of a liquid, and a solution (an organic base solution) obtained by dissolving the organic base in an organic solvent can be prepared in the case of a solid, and the semiconductor according to the present invention is immersed in the liquid organic base or the organic base solution to perform a surface treatment on the semiconductor.

(Preparation of Photoelectric Conversion Layer)

A method for preparing a photoelectric conversion layer (semiconductor layer) will be described.

When a semiconductor for the semiconductor layer is in a particle form, (1) a method which comprises coating or spraying a dispersion or colloidal solution of a semiconductor (semiconductor-containing coating liquid) to a conductive support, to prepare a semiconductor layer; (2) a method which comprises coating a precursor of semiconductor fine particles to a conductive support, hydrolyzing with a moisture content (for example, moisture content in the air), and thereafter performing condensation (sol-gel method), or the like can be used. The method (1) is preferable. When the semiconductor according to the present invention is in a membranous form, and is not disposed on the conductive support, the semiconductor layer is preferably prepared by laminating the semiconductor on the conductive support.

A preferable embodiment of a method for preparing a semiconductor layer includes a method which comprises forming a semiconductor layer on the conductive support by calcining using fine particles of a semiconductor.

When the semiconductor according to the present invention is prepared by calcination, sensitizing treatment of the semiconductor using a dye (such as adsorption and filling into a porous layer) is preferably performed after calcination. After calcination, an adsorption treatment of the compound is preferably quickly performed before adsorbing water to the semiconductor.

A method of forming a semiconductor layer preferably used in the present invention by calcination using semiconductor fine powder will be specifically described below.

(Preparation of Semiconductor-Containing Coating Liquid)

Firstly, a coating liquid containing a semiconductor, preferably semiconductor fine powder (a semiconductor-containing coating liquid) is prepared. The semiconductor fine powder preferably has a primary particle diameter as small as fine as possible, and the primary particle diameter is preferably 1 to 5000 nm, and more preferably 2 to 100 nm. The coating liquid containing semiconductor fine powder can be prepared by dispersing the semiconductor fine powder in a solvent.

The semiconductor fine powder dispersed in the solvent is dispersed in the form of primary particulate. The solvent is not particularly limited as long as it can disperse the semiconductor fine powder. For the solvent, examples thereof include water, an organic solvent, and a mixed solution of water and an organic solvent. For the organic solvent, alcohols such as methanol, ethanol, and isopropanol, ketones such as methyl ethyl ketone, acetone and acetylacetone, hydrocarbons such as hexane and cyclohexane, cellulose derivatives such as acetyl cellulose, nitrocellulose, acetylbutyl cellulose, ethyl cellulose, and methyl cellulose are used. Into the coating liquid, surfactants, acids (such as acetic acid and nitric acid), viscosity modifiers (polyvalent alcohols such as polyethylene glycol), and chelating agents (such as acetylacetone) can be optionally added. A concentration of semiconductor fine powder in a solvent is preferably within the range from 0.1 to 70% by weight, and more preferably from 0.1 to 30% by weight.

(Coating of Semiconductor-Containing Coating Liquid and Calcination Treatment of Formed Semiconductor Layer)

A semiconductor-containing coating liquid obtained as described above is coated or sprayed onto the conductive support, dried, then fired in the air or an inert gas, to form a semiconductor layer (also referred to as a semiconductor film) on the conductive support. Herein, a coating method is not particularly limited, and examples thereof include known methods such as a doctor blade method, a squeegee method, a spin coating method, and a screen printing method.

The film obtained by coating the semiconductor-containing coating liquid on the conductive support and drying is made of aggregation of semiconductor fine particles, and a particle diameter of the fine particle corresponds to a primary particle diameter of the semiconductor fine powder.

A semiconductor layer (semiconductor fine particle layer) formed on a conductive layer such as a conductive support generally has weak bonding force with the conductive support and weak bonding force between the fine particles, and thus has poor mechanical strength. Therefore, in order to form a semiconductor layer having increased mechanical strength and firmly adhered to a substrate, a calcination treatment on the semiconductor layer (semiconductor fine particle layer) is performed.

The semiconductor layer may have any structure and preferably has a porous film (also referred to as a porous layer having voids). When the semiconductor layer is a porous film, it is preferable that components such as a hole transport substance of a solid hole transport layer are present also in this void. Herein, the porosity (D) of the semiconductor layer is not particularly limited, and preferably 1 to 90% by volume, more preferably 10 to 80% by volume, and particularly preferably 20 to 70% by volume. A porosity of a semiconductor layer means a porosity having penetrability in the thickness direction of a dielectric material, and can be measured using a commercially available device such as a mercury porosimeter (SHIMADZU Pore Sizer 9220 type).

A film thickness of a semiconductor layer formed as a calcined product film having a porous structure is not particularly limited, and preferably at least 10 nm or more, and more preferably 500 nm to 30 μm. Within such a range, a semiconductor layer excellent in characteristics such as permeability and conversion efficiency can be formed. A semiconductor layer may be a single layer formed from semiconductor fine particles having approximately the same average particle diameters, or a multilayer film (layered structure) made from semiconductor layers comprising semiconductor fine particles having different average particle diameters or of different kinds.

The calcination condition is not particularly limited. From the viewpoint of suitably adjusting an actual surface area of calcined film and obtaining a calcined film having the above porosity at the time of the calcination treatment, the calcination temperature is preferably lower than 1000° C., more preferably within the range from 100 to 800° C., and particularly preferably within the range from 300 to 800° C. In addition, in the case that a substrate is plastic, or the like, and has deteriorated heat resistance, pressurization can be applied to adhere fine particles each other or fine particles with a substrate instead of performing a calcination treatment at 200° C. or more, or a semiconductor layer can be subjected only to a heat treatment with microwaves without heating a substrate. From the above viewpoint, a calcination time is preferably from 10 seconds to 12 hours, more preferably from 1 to 240 minutes, and particularly preferably from 10 to 120 minutes. A calcination atmosphere is also not particularly limited, and the calcination step is generally carried out in the air or an inert gas (for example, argon, helium, and nitrogen) atmosphere. The calcination may be performed once at a single temperature or repeated twice or more by changing a temperature and a time.

A ratio of an actual surface area to an apparent surface area can be controlled by a particle diameter and a specific surface area of a semiconductor fine particle, a calcination temperature, and the like. For the purpose of enhancing electron injection efficiency from a dye to a semiconductor particle by increasing a surface area of a semiconductor particle or increasing a purity of a semiconductor particle periphery after the heat treatment, for example, chemical plating treatment using an aqueous titanium tetrachloride solution or an electrochemical plating treatment using an aqueous titanium trichloride solution may be performed.

(Sensitizing Treatment on Semiconductor Layer)

A total support amount of the dye in the present invention per 1 $m^2$ of the semiconductor layer is not particularly limited, and preferably within the range from 0.01 to 100 mmol, more preferably within the range from 0.1 to 50 mmol, and particularly preferably within the range from 0.5 to 20 mmol.

When a sensitizing treatment is carried out, a sensitizing dye may be used solely or plural sensitizing dyes may be used in combination, or a sensitizing dye may also be used in mixing with another compounds (for example, compounds described in U.S. Pat. Nos. 4,684,537; 4,927,721; 5,084,365; 5,350,644; 5,463,057; and 5,525,440; JP-A-7-249790 and JP-A-2000-150007).

Particularly, when the photoelectric conversion element of the present invention is applied to a solar cell described later, two or more kinds of dyes having different absorption wavelengths are preferably used by mixing so as to extend a wavelength range of photoelectric conversion as wide as possible to use solar light effectively.

A method of supporting a sensitizing dye on a semiconductor is not particularly limited, and known methods can be applied in the same manner or with suitable modification. For example, to support a sensitizing dye on a semiconductor, a method of dissolving a sensitizing dye in a suitable solvent and immersing a thoroughly-dried semiconductor layer in the solution for a long time may be generally used. In a sensitizing treatment by using plural sensitizing dyes in combination or using another dye in combination, a mixed solution of respective dyes may be prepared to be used, or separate solutions of respective dyes may be prepared and a semiconductor layer can be sequentially immersed in each solution to be prepared. When separate solutions of respective sensitizing dyes are prepared and a semiconductor layer can be sequentially immersed in each solution to be prepared, the order of impregnating a semiconductor with sensitizing dyes, and the like may be any order. Alternatively, semiconductor fine particles to which the dye is adsorbed solely may be mixed to prepare a semiconductor layer.

In the case of a semiconductor having a high porosity, an adsorption treatment on sensitizing dyes, and the like is preferably completed before adsorbing water to voids on a semiconductor layer and the inside of the semiconductor layer due to water, water vapor, etc.

A sensitizing treatment on a semiconductor is carried out by dissolving the sensitizing dye into a suitable solvent and immersing a substrate on which a semiconductor is fired in the solution, as described above. In this treatment, air bubbles in the film are preferably removed by previously carrying out a depressurization treatment or a heat treatment on the substrate on which the semiconductor layer (also referred to as the semiconductor film) is formed by calcination. Due to such a treatment, a sensitizing dye can deeply enter the inside of the semiconductor layer (semiconductor thin film), and it is particularly preferable when the semiconductor layer (semiconductor thin film) is a porous film.

A solvent used for dissolving a sensitizing dye is not particularly limited as long as it can dissolve a sensitizing dye, and does not dissolve a semiconductor nor react with a semiconductor. However, deaeration and distillation purification are preferably previously performed in order to prevent a water and gas dissolved in a solvent from entering into a semiconductor film to hinder a sensitizing treatment such as adsorption of a sensitizing dye. Examples of a solvent preferably used for dissolving a sensitizing dye include nitrile solvents such as acetonitrile, alcohol solvents such as methanol, ethanol, n-propanol, isopropanol, and t-butylalcohol, ketone solvents such as acetone and methyl ethyl ketone, ether solvents such as diethylether, diisopropylether, tetrahydrofuran, and 1,4-dioxane, and halogenated hydrocarbon solvents such as methylene chloride and 1,1,2-trichloroethane. These solvents may be used alone or two or more kinds may be used in mixing. Among these solvents, acetonitrile, methanol, ethanol, n-propanol, isopropanol, t-butylalcohol, acetone, methyl ethyl ketone, tetrahydrofuran and methylene chloride, and mixed solvents thereof, for example, an acetonitrile/methanol mixed solvent, an acetonitrile/ethanol mixed solvent, and an acetonitrile/t-butylalcohol mixed solvent, are preferable.

(Temperature and Time of Sensitizing Treatment)

Conditions of the sensitizing treatment are not particularly limited. For example, a time for immersing a substrate on which a semiconductor has been calcined in a solution containing a sensitizing dye is preferable for sufficiently progressing adsorption by deeply entering into the semiconductor layer (semiconductor film) to fully sensitizing the semiconductor. Further, from the viewpoint of suppressing inhibition of adsorption of a dye by a decomposed substance that is generated due to decomposition, or the like of the dye in a solvent, a temperature of the sensitizing treatment is preferably 0 to 80° C., and more preferably 20 to 60° C. From the same viewpoint, a time for the sensitizing treatment is preferably 15 minutes to 20 hours, and more preferably 3 to 24 hours. Particularly, the sensitizing treatment is performed preferably for 2 to 48 hours, and particularly preferably 3 to 24 hours under the condition of room temperature (25° C.). The effect thereby can be significant particularly attained in the case that the semiconductor layer is a porous film. However, the immersion time is a value in the condition at 25° C., and when the temperature condition is changed, the immersion time is not limited to the above range. From the viewpoint of shortening the adsorption time and being adsorbed up to the deep portion of a porous electrode, the sensitizing treatment may be performed under reduced pressure or vacuum.

In the immersion, a solution containing the dye according to the present invention may be heated up to a temperature not enough for boiling as long as the dye does not decomposed. A temperature range is preferable from 5 to 100° C., and more preferably from 25 to 80° C., but is not limited thereto when the solvent boils within the above temperature range.

(Solid Hole Transport Layer)

A solid hole transport layer is a layer that serves to rapidly reduce an oxidant of a sensitizing dye after absorbing light and injecting electrons into a semiconductor and to transport holes injected in the interface with the sensitizing dye to a second electrode.

The solid hole transport layer comprises a polymer obtainable by polymerizing a compound represented by the following general formula (2) or a multimer of the compound (hereafter simply referred to as a "polymer").

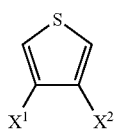

General formula (2)

In the general formula (2), $X^1$ and $X^2$ represent a hydrogen atom, a linear or branched alkyl group having 1 to 24 carbon atoms, an aryl group having 6 to 24 carbon atoms, —$OR^4$ group, —$SR^5$ group, —$SeR^6$ group, or —$TeR^7$ group. $X^1$ and $X^2$ may be the same or different. $R^4$ to $R^7$ represent a hydrogen atom or a linear or branched alkyl group having 1 to 24 carbon atoms. Herein, $X^1$ and $X^2$ may bond with each other to form a ring structure.

The above linear or branched alkyl group having 1 to 24 carbon atoms for $X^1$, $X^2$, and $R^4$ to $R^7$ is not particularly limited, and can be the same as the alkyl group in the above general formula (1).

Among these, as $X^1$ and $X^2$, a linear or branched alkyl group having 6 to 18 carbon atoms is preferable, a linear alkyl group having 6 to 18 carbon atoms is more preferable. In addition, when the polymer has an alkyl group with a long chain (for example, 6 to 18 carbon atoms), it is presumed that the alkyl group acts as a functional group that suppresses self-cohesion to improve durability due to formation of self-cohesion structure.

As $R^4$ to $R^7$, a linear or branched alkyl group having 1 to 5 carbon atoms is preferable, a linear alkyl group having 1 to 5 carbon atoms is more preferable.

The above aryl group having 6 to 24 carbon atoms for $X^1$ and $X^2$ is not particularly limited, and can be the same as the aryl group in the above general formula (1).

In $X^1$ and $X^2$ and $R^4$ to $R^7$, at least one of hydrogen atoms in the "linear or branched alkyl group having 1 to 24 carbon atoms" and "aryl group having 6 to 24 carbon atoms" may be substituted by a substituent.

In $X^1$ and $X^2$ and $R^4$ to $R^7$, substituents are selected from the group consisting of a halogen atom, each substituted or non-substituted linear or branched alkyl group having 1 to 24 carbon atoms, a hydroxyalkyl group having 1 to 18 carbon atoms, an alkoxy group having 1 to 18 carbon atoms, an acyl group having 1 to 32 carbon atoms, an aryl group having 6 to 24 carbon atoms, an alkenyl group having 2 to 32 carbon atoms, an amino group, and a heteroaryl group having 2 to 24 carbon atoms. These specific groups can be the same as those groups in the above general formula (1).

The above substituents for $X^1$, $X^2$, and $R^4$ to $R^7$ are preferably a linear alkyl group having 6 to 18 carbon atoms, more preferably an n-octyl group.

Preferable examples of the compound represented by the above general formula (2) include the following compounds (H1-1) to (H1-7). However, the present invention is not limited thereto. In the following examples, the polymer constituting the solid hole transport layer is specified by the following symbol.

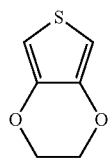

H1-1

H1-2

H1-3

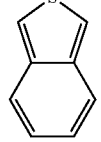

H1-4

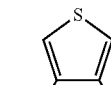

H1-5

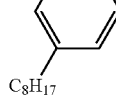

H1-6

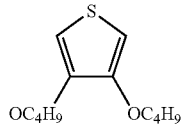

H1-7

A terminal of the polymer is not particularly limited, and can suitably be defined depending on kinds of raw materials to be used (such as a monomer, dimer, and multimer), and is generally a hydrogen atom. Herein, the polymer to be used for the present invention may be formed only from the compound represented by the above general formula (2) or may be formed from the compound represented by the above general formula (2) and another monomer. Preferably, the polymer is formed only from the compound represented by the above general formula (2). In this time, the polymer may be formed only from one compound represented by the above general formula (2) or may be formed of a plurality of compounds represented by the above general formula (2).

Another monomer is not particularly limited as long as it does not hinder characteristics of the polymer according to the present invention, and known monomers can be used. Specific examples include monomers such as a pyrrole derivative, a furan derivative, and a thiadiazole derivative; and a monomer having a π conjugate structure.

The polymer to be used for the present invention can be obtained by polymerizing or copolymerizing one, or at least two kinds of compounds represented by the above general formula (2) or multimers of these compounds, optionally with another monomer in the presence of a metal complex as a polymerization catalyst.

Herein, as the compound represented by the above general formula (2), the compound (monomer) exemplified above can be used. In addition, a multimer (oligomer; hereinafter also referred to as "multimer" collectively) such as a dimer or a trimer of a compound represented by the general formula (2) can be used in the above polymerization or copolymerization.

For example, dimers (H2-1) to (H2-7) of the above compounds (H1-1) to (H1-7) may be preferably used.

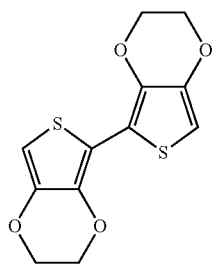

H2-1

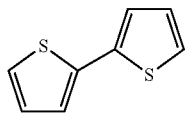

H2-2

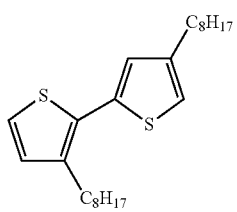

H2-3

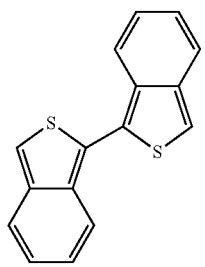

H2-4

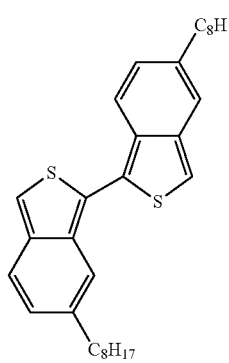

H2-5

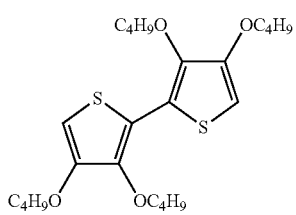

H2-6

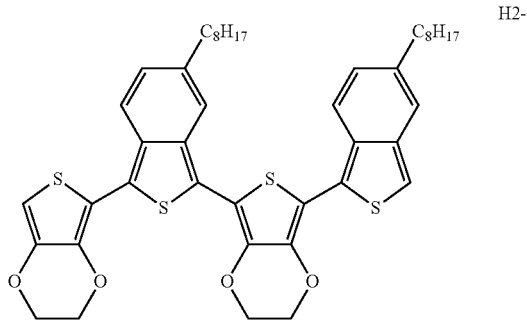

H2-7

Use of a multimer such as a dimer is preferable since an oxidation potential in polymer formation is small and apolymerization speed of apolymer is shortened as compared to the case of using a monomer. The oligomer of the monomers can be synthesized by, for example, the method described in J. R. Reynolds et. al., Adv. Mater., 11, 1379 (1999) or a method having the method suitably modified. The dimmers of monomers can be synthesized by, for example, the method described in T. M. Swager et. al., Journal of the American Chemical Society, 119, 12568 (1997) or a method having the method suitably modified.

For example, a preferable example of a method for producing 3,4-ethylene dioxythiophene (PEDOT) dimer (H2-1) which is a dimer of the monomer (H1-1) for the above polymer will be described below. However, the present invention is not limited to the following preferable example and other similar methods and other known methods can be applied.

Synthesis of 3,4-ethylene dioxythiophene (PEDOT) dimer 750 mL of anhydrous tetrahydrofuran and 25 g of 3,4-ethylene dioxythiophene (0.15 mol) are added to a 1000 mL three-necked glass flask equipped with a stirrer, a thermometer, and a reflux condenser tube. The mixture is cooled in an acetone/dry ice bath until the internal temperature reaches −70° C. while stirring under a nitrogen stream. Thereafter, 1.6 mol/L of n-butyl lithium hexane solution (113 mL, 0.18 mol) is dropped through a syringe into the reaction system for 5 minutes. After 25 minutes, 23.5 g (0.17 mol) of anhydrous copper chloride is added thereto and stirred for about 3 hours for reaction. The reaction solution was added to 10 L of water and the obtained product was filtrated, followed by drying. The dried product was purified by silica gel chromatography (mobile phase: methylene chloride) to obtain 17.9 g (yield: about 72%) of PEDOT dimer as a yellow white crystal.

(Polymerization Method of Polymer)

A polymerization method is not particularly limited and, for example, a known method such as a method described in JP-A-2000-106223 can be applied. Specifically, examples thereof include a chemical polymerization method using a polymerization catalyst, an electrolytic polymerization method in which at least a working electrode and a counter electrode are provided and a voltage is applied between the both electrodes to be reacted, and a photopolymerization method by light irradiation solely or in combination with a polymerization catalyst, heating, electrolysis, and the like. Among these methods, a polymerization method using electrolytic polymerization method is preferable. A photopolymerization method of combining the electrolytic polymerization method with light irradiation is more preferable. A polymer layer can be finely formed on a titanium oxide surface by using the electrolytic polymerization method in combination with the photopolymerization method of polymerizing by light irradiation.

When a polymer is obtained by an electrolytic polymerization method, synthesis of a polymer directly leads to formation of the solid hole transport layer. That is, an electrolytic polymerization method as follows is carried out. In general, a mixture containing a monomer that constitutes the polymer, a support electrolyte, a solvent, and optionally an additive is used.

The monomer represented by the general formula (2), a multimer of the monomer, and optionally another monomer are dissolved in a suitable solvent, and a support electrolyte is added thereto, to prepare a solution for electrolytic polymerization.

The solvent used herein is not particularly limited as long as it can dissolve a support electrolyte, and the monomer or multimers thereof, and an organic solvent having a comparatively wide potential window is preferably used. Specific examples thereof include organic solvents including polar solvents such as tetrahydrofuran (THF), butylene oxide, chloroform, cyclohexanone, chlorobenzene, acetone, and various alcohols; and non-protonic solvents such as dimethylformamide (DMF), acetonitrile, dimethoxyethane, dimethyl sulfoxide, hexamethylphosphoric triamide, propylene carbonate, dichloromethane, o-dichlorobenzene, and methylene chloride. Alternatively, a mixed solvent that is prepared by adding optionally water and other organic solvents to the above solvent may be used. In addition, the solvent may be used alone or in a form of a mixture of two or more kinds.

For the support electrolyte, electrolytes capable of ionization can be used, not limited to particular one, and those having high solubility to a solvent, which are not susceptible to oxidation and reduction, are preferably used. Specifically, preferable examples thereof include salts such as lithium perchlorate (LiClO$_4$), lithium tetrafluoroborate, tetrabutyl ammonium perchlorate, Li[(CF$_3$SO$_2$)$_2$N], (n-C$_4$H$_9$)$_4$NBF$_4$, (n-C$_4$H$_9$)$_4$NPF$_4$, p-toluenesulfonic acid salt, and dodecyl benzenesulfonic acid salt. Alternatively, polymer electrolytes described in JP-A-2000-106223 (for example, PA-1 to PA-10 cited in the publication) may be used as the support electrolyte. The support electrolyte may be used alone or in a form of a mixture of two or more kinds.

Examples of the additive which can be added to the solid hole transport layer include various additives including acceptor doping agents such as N(PhBr)$_3$SbCl$_6$, NOPF$_6$, SbCl$_5$, I$_2$, Br$_2$, HClO$_4$, (n-C$_4$H$_9$)$_4$ClO$_4$, trifluoroacetic acid, 4-dodecylbenzenesulfonate, 1-naphthalenesulfonate, FeCl$_3$, AuCl$_3$, NOSbF$_6$, AsF$_5$, NOBF$_4$, H1-3[PMo$_{12}$O$_{40}$], and 7,7,8,8-tetracyanoquinodimethane (TCNQ), binder resins that hardly trap a hole, coating improving agents such as a leveling agent. The additives may be used alone or in a form of a mixture of two or more kinds.

Then, the substrate 1 on which the first electrode (transparent conductive film) 2, the barrier layer 3 and the photoelectric conversion layer 6 are formed is immersed in the solution for electrolytic polymerization, and directly subjected to electrolysis using the photoelectric conversion layer 6 as a working electrode, a platinum wire or a platinum plate as a counter electrode, and Ag/AgCl, Ag/AgNO$_3$ or the like as a reference electrode. A concentration of the monomer or multimer thereof in the solution for electrolytic polymerization is not particularly limited, and is preferably approximately 0.1 to 1000 mmol/L, more preferably approximately 1 to 100 mmol/L, and particularly preferably approximately 5 to 20 mmol/L. A concentration of the support electrolyte is preferably approximately 0.01 to 10 mol/L, and more preferably approximately 0.1 to 2 mol/L. An electric current density to be applied is desirably within the range from 0.01 mA/cm$^2$ to 1000 mA/cm$^2$, and particularly desirably within the range from 1 mA/cm$^2$ to 500 mA/cm$^2$. A retention voltage is preferably −0.5 to +0.2 V, and more preferably −0.3 to 0.0 V. A temperature range of the solution for electrolytic polymerization is suitably such a range as that the solvent does not solidify or explosively boil, and generally from −30° C. to 80° C. Conditions such as an electrolysis voltage, an electrolysis current, an electrolysis time, a temperature can depend on materials to be used, and thus, the conditions can be suitably selected in consideration of a desired film thickness.

A polymerization degree of a polymer obtained by electrolytic polymerization is understood with difficulties. For a method of confirming a polymer or not, the polymerization degree can be determined with the solubility when the solid hole transport layer is immersed in tetrahydrofuran (THF) that is a solvent capable of dissolving the compound of the general formula (2) or the multimer of the compound, since the solvent solubility of the solid hole transport layer formed after polymerization is largely reduced.

Specifically, 10 mg of a compound (polymer) is charged in a 25 ml-sample bottle, 10 ml of THF is added thereto, and when the ultrasonic wave (25 kHz, 150 W, ULTRASONIC ENGINEERING CO., LTD. COLLECTOR CURRENT 1.5 A, manufactured by ULTRASONIC ENGINEERING CO., LTD., 150) is irradiated for 5 minutes, a case of 5 mg or less of the dissolved compound is determined as being polymerized.

Preferably, the solubility when the solid hole transport layer is immersed in tetrahydrofuran (THF) is from 0.1 to 3 mg.

On the other hand, when chemical polymerization is carried out using a polymerization catalyst, for example, a monomer represented by the general formula (2) or the multimer thereof can be polymerized using a polymerization catalyst as below.

The polymerization catalyst is not particularly limited, and examples thereof include iron (III) chloride, iron (III) tris-p-toluenesulfonate, iron (III) p-dodecylbenzenesulfonate, iron (III) methanesulfonate, iron (III) p-ethylbenzenesulfonate, iron (III) naphthalenesulfonate, and hydrates thereof.

A polymerization modifier may be used in chemical polymerization in addition to a polymerization catalyst. The polymerization modifier is not particularly limited as long as it has a weak complexing to trivalent iron ion in the polymerization catalyst and reduces a polymerization speed so that a film can be formed. For example, when a polymerization catalyst is iron (III) chloride and a hydrate thereof, examples thereof include aromatic oxysulfonic acids such as 5-sulphosalicylic acid. When a polymerization catalyst is iron (III) tris-p-toluenesulfonate, iron (III) p-dodecylbenzenesulfonate, iron (III) methanesulfonate, iron (III) p-ethylbenzenesulfonate, iron (III) naphthalenesulfonate, and a hydrate thereof, examples thereof include imidazole, and the like.

The polymer may be incorporated in a coating liquid, or the like containing the polymer to provide on a photoelectric conversion layer after being synthesized, but it is preferable that polymerization is carried out on the photoelectric conversion layer to form a solid hole transport layer. That is, electrolytic polymerization of the monomer or the multimer thereof is preferably carried out on the photoelectric conversion layer.

In this case, a solution for forming solid hole transport layer that contains the monomer of the general formula (2) or the multimer thereof, the support electrolyte, the polymerization catalyst, the polymerization modifier, another additive, and a solvent is used. As the solvent for the solid hole transport layer forming solution, those exemplified as the solvents of the electrolytic polymerization solution can be used.

A total concentration of the these components in the solution for forming solid hole transport layer may be varied depending on a kind, an amount ratio of each of the monomer of the general formula (2) or the multimer thereof, the polymerization catalyst, the polymerization modifier, and another additive, conditions for a coating method, and a desired film thickness after polymerization, and the concentration (solid content concentration) is approximately within the range from 1 to 50% by weight.

A polymerization reaction is carried out after coating the solution for forming solid hole transport layer on a photoelectric conversion layer by a coating method, or with a photoelectric conversion layer immersed in the solution for forming solid hole transport layer.

The conditions of the polymerization reaction may be varied depending on a kind, an amount ratio, a concentration of each of the monomer of the general formula (2) or the multimer thereof, the polymerization catalyst, and the polymerization speed adjuster, a thickness of a liquid film in the stage of coating, and a desired polymerization speed. For preferable polymerization conditions, a heating temperature in the case of heating in the air is within the range from 25 to 120° C., and a heating time is preferably within the range from 1 minute to 24 hours.

A coating method is not particularly limited, and a known method can be used in the same manner or with suitable modification. Specifically, various coating methods such as dipping, dropping, doctor blade, spin coating, brush coating, spray coating, roll coater, air knife coating, curtain coating, wire-bar coating, gravure coating, extrusion coating using a hopper, described in U.S. Pat. No. 2,681,294, and multilayer simultaneous coating described in U.S. Pat. Nos. 2,761,418; 3,508,947; and 2761791 can be used. Such coating may be repeatedly carried out to form a laminated layer. In this case, the number of coating is not particularly limited and can be suitably selected according to a thickness of a desired solid hole transport layer.

The content of the polymer obtainable by polymerizing the compound represented by the following general formula (2) or the multimer of the compound in the solid hole transport layer is not particularly limited. In considering hole transport characteristics, suppression and prevention ability of disappearance of an exciter generated around the interface of the photoelectric conversion layer, and the like, the content of the polymer is preferably 50 to 100% by weight, and more preferably 90 to 100% by weight, based on the whole monomer.

The polymer is preferably hole-doped in order to enhance conductivity of the solid hole transport layer. The hole-doping amount is not particularly limited, and is preferably 0.15 to 0.66 (holes) per the compound of the general formula (2).

In electrolytic polymerization, the polymer having a structure derived from the compound represented by the general formula (2) is oxidized by applying an electric field to be hole-doped.

In order to reduce an oxidant of a sensitizing dye in the photoelectric conversion layer, the polymer according to the present invention preferably has an ionized potential smaller than that of a dye adsorption electrode. A range of the ionized potential of the polymer is not particularly limited and may be varied depending on a sensitizing dye to be used. In a state that the polymer is doped, the ionized potential of the polymer is preferably from 4.5 eV to 5.5 eV, and more preferably from 4.7 eV to 5.3 eV.

Further, a preferable solid hole transport layer has an absorbance of 1.0 or less, since loss of light in absorption is decreased and degradation due to light can be suppressed when a visible light absorption is low. Further, when the polymerization degree of the polymer increases, absorbance slightly increases, and in order to attain a polymerization degree having preferable hole transport ability, a charge transport layer having a polymerization degree showing absorbance of 0.2 or more is preferable. Therefore, the polymer according to the present invention has an absorbance in 400 to 700 nm (an average value of absorbance within the wavelength region from 400 to 700 nm) of preferably 0.2 to 1.0.

In the present description, absorbance of the solid hole transport layer (polymer) is defined using an absorbance gap of a working electrode before and after electrolytic polymerization, and the absorbance means an average absorbance measured within the wavelength region from 400 to 700 nm. The absorbance is measured using a spectrophotometer (JASCO V-530). For the working electrode, one obtained by adsorbing a dye to a titanium oxide thin film with an effective area of 10×20 mm$^2$, which is formed on a FTO conductive glass substrate, is used; and immersed in a solution with the same composition as that of the solution for electrolytic polymerization as mentioned above. A polymer having a repeating unit derived from the compound represented by the general formula (2) is formed on the working electrode by using a platinum wire as a counter electrode and Ag/Ag$^+$ (AgNO$_3$ 0.01M) as a reference electrode, and setting a retention voltage at −0.16 V, and maintaining the voltage for 30 minutes while irradiating light from the direction of the semiconductor layer (using xenon lamp, light intensity of 22 mW/cm$^2$, cutting a wavelength of 430 nm or less), which is used for measurement of absorbance. In order to correct influence of variation of film thicknesses, a film thickness of a sample is measured and a value obtained by dividing the absorbance with the film thickness (μm) is used. A film thickness is measured by Dektak 3030 (manufactured by SLOAN TECHNOLOGY Co.).

(Barrier Layer)

The photoelectric conversion element of the present invention preferably comprises as means for prevention of short circuit a barrier layer between the first electrode and the semiconductor layer, which is in a membrane form (layered form).

A materials which can constitute the barrier layer is not particularly limited and, for example, one or combination of at least two of zinc, niobium, tin, titanium, vanadium, indium, tungsten, tantalum, zirconium, molybdenum, manganese, iron, copper, nickel, iridium, rhodium, chromium, ruthenium or oxides thereof, or perovskites such as strontium titanate, calcium titanate, barium titanate, magnesium titanate, and strontium niobate, or complex oxides or oxide mixtures thereof, and various metal compounds such as CdS, CdSe, TiC, $Si_3N_4$, SiC, and BN can be used.

Particularly when the solid hole transport layer is a p-type semiconductor, and a metal is used for the barrier layer, a metal having a smaller value of a work function than that of the solid hole transport layer and contacting in the schottky-type is preferably used. When a metal oxide is used for the barrier layer, a metal oxide which ohmically contacts with a transparent conductive layer, and has an energy level in the conduction band lower than that of the semiconductor layer (photoelectric conversion layer) is preferably used. In this case, selection of an oxide makes it possible to improve electron transfer efficiency from the semiconductor layer (photoelectric conversion layer) to the barrier layer. Among these, a barrier layer having conductivity equivalent to the semiconductor layer (photoelectric conversion layer) is preferable, and particularly, a barrier layer made mainly of titanium oxide is more preferable.

The structure of the barrier layer is not particularly limited. The barrier layer is preferably a porous structure film, as with the photoelectric conversion layer. However, it is preferable that a porosity of the barrier layer is smaller than that of the semiconductor layer (photoelectric conversion layer). Specifically, when the porosity of the barrier layer is assumed to be C [%], and the porosity of the semiconductor layer is assumed to be D [%], D/C is, for example, preferably about 1.1 or more, more preferably about 5 or more, and further more preferably about 10 or more. The upper limit of D/C is preferably as large as possible and thus is not particularly necessarily prescribed, but the upper limit of D/C is generally about 1000 or less. Accordingly, the barrier layer and the semiconductor layer can more favorably exhibit their functions, respectively.

More specifically, the porosity C of the barrier layer is, for example, preferably about 20% or less, more preferably about 5% or less and further more preferably about 2% or less. That is, the barrier layer is preferably a dense layer. By this, the effects can be more improved. The lower limit of the porosity C of the barrier layer is preferably as small as possible and thus is not particularly necessarily prescribed, but the lower limit of the porosity C is generally about 0.05% or more.

An average thickness of the barrier layer (film thickness) is, for example, preferably about 0.01 to 10 μm, and more preferably about 0.03 to 0.5 μm. By this, the effects can be more improved.

(Second Electrode)

The second electrode may be an electrode having conductivity and any conductive material is used. An insulating substance can be even used when a conductive substance layer is set on the side facing to a solid hole transport layer. The second electrode preferably has good contact property with the solid hole transport layer. The second electrode preferably has a small difference in work function from the solid hole transport layer, and is also preferably chemically stable. Such a material is not particularly limited, and examples thereof include metal thin films of gold, silver, copper, aluminum, platinum, rhodium, magnesium, indium, conductive metal oxides (e.g., indium-tin complex oxide and fluorine-doped tin oxide), and organic conductive materials such as carbon, carbon black, conductive polymers. A thickness of the second electrode is also not particularly limited, and preferably 10 to 1000 nm. The surface resistance of the second electrode is not particularly limited and preferably low, and specifically, the surface resistance of the second electrode is preferably 80 Ω/cm² or less, and more preferably 20 Ω/cm² or less. The lower limit of the surface resistance of the second electrode is preferably as low as possible and thus is not particularly necessarily prescribed, but 0.01 Ω/cm² or more is sufficient.

A method of forming the second electrode is not particularly limited and known methods can be applied. For example, methods such as deposition (including vacuum deposition), sputtering, coating, and screen printing of the above materials for the second electrode are preferably used.

(Solar Cell)

The photoelectric conversion element of the present invention can be particularly preferably used in a solar cell. Therefore, the present invention also provides a solar cell which comprises the photoelectric conversion element.

The solar cell of the present invention comprises the photoelectric conversion element of the present invention, a design and circuit design, which are the most suitable for the solar light, are attained, and the solar cell has a structure in which most suitable photoelectric conversion is performed when the solar light is used as the light source. That is, it has a structure in which the solar light is irradiated to a dye sensitized semiconductor. In forming the solar cell of the present invention, it is preferable that the photoelectric conversion layer, the solid hole transport layer and the second electrode are stored and sealed in a container or the entirety of them is resin-sealed.

When the solar light or electromagnetic wave equivalent to the solar light is irradiated to the solar cell of the present invention, a sensitizing dye supported on a semiconductor absorbs irradiated light or electromagnetic wave to be excited. Electrons generated due to excitation transfer to the semiconductor, and then transfer to the second electrode through the conductive support and external load, to be supplied to a hole transport material of a solid hole transport layer. On the other hand, the sensitizing dye which transferred electrons to the semiconductor becomes an oxidant, but the oxidant gets back to be the original state due to reduction by supplying electrons through the polymer of the solid hole transport layer from the second electrode and, at the same time, the polymer of the solid hole transport layer is oxidized and again gets back to a state that can be reduced by electrons supplied from the second electrode. As described above, electrons flow, and a solar cell using the photoelectric conversion element of the present invention can be constituted.

EXAMPLES

The present invention will be described with reference to examples below, and the present invention is not limited thereto.

Example 1

Preparation of Photoelectric Conversion Element SC-1

A commercial fluorine-doped tin oxide (FTO) conductive glass substrate (coating amount of FTO: 7 g/m², thickness of first electrode: 0.9 μm, thickness of conductive support: 1.1 mm) having a surface resistance of 9 Ω/square was used as the conductive support. The conductive glass substrate was cleaned with a cleaning liquid (an alkaline detergent (Cica Clean LX-3, manufactured by Kanto Kagaku)/ultrapure water=10/90) for 15 minutes while irradiating the liquid with ultrasonic wave. Thereafter, the substrate was cleaned with ultrapure water. The cleaning with the cleaning liquid and the cleaning with ultrapure water were repeated 3 times. Thereafter, UV/ozone cleaning was performed for 15 minutes using an UV lamp made of synthetic quartz glass.

TC100 (manufactured by Matsumoto Trading Co., Ltd): titanium diisopropoxy bis(acetylacetonate) as the barrier layer was coated on the cleaned substrate (the conductive substrate) by a spin coating method. The resulting substrate was dried by heating at 80° C. for 10 minutes, followed by calcining at 450° C. for 10 minutes to obtain a barrier layer having a film thickness of 100 nm (porosity C, 1.0%).

A titanium oxide paste (particle diameter of 18 nm) was coated on the layer by a doctor blade method. The paste was heated to be dried at 120° C. for 5 minutes, followed by calcining at 500° C. for 30 minutes to obtain a porous titanium oxide layer having a thickness of 4.5 μm (semiconductor layer: porosity D: 50% by volume).

A sensitizing dye D-10 and 10 eq of chenodexycholic acid based on the sensitizing dye were dissolved in a mixed solvent of acetonitrile:t-butylalcohol=1:1, to prepare a solution (sensitizing dye concentration: $3 \times 10^{-4}$ mol/L). The above FTO substrate (conductive substrate) on which the porous titanium oxide layer (semiconductor layer) was formed was immersed in this solution at room temperature for 3 hours to perform an adsorption treatment of a sensitizing dye, and thereby the sensitizing dye is supported on the semiconductor in the semiconductor layer to obtain a photoelectric conversion layer, and thus, a photoelectric conversion electrode was obtained. The total support amount of the sensitizing dye of the present invention per 1 m² of the semiconductor layer in this treatment was 2 mmol.

The semiconductor electrode was immersed in an acetonitrile solution (electrolytic polymerization solution) containing a dimer of the monomer: H1-1 that corresponds to the general formula (2) in a ratio of 0.01 (mol/L), and Li[(CF$_3$SO$_2$)$_2$N] in a ratio of 0.1 (mol/L). In this time, the temperature of the electrolytic polymerization solution was adjusted at 25° C. The semiconductor electrode was used as a working electrode, a platinum wire was used as a counter electrode, Ag/Ag$^+$ (AgNO$_3$ 0.01 M) was used as a reference electrode, and a retention voltage was set at −0.16 V. An electric current density at initiation of electrolysis was 100 μA/cm² and the electric current density at completion was 2 μA/cm². The voltage was kept for 30 minutes while irradiating light from the direction of the semiconductor layer (using xenon lamp, light intensity of 22 mW/cm², cutting a wavelength of 430 nm or less), to form a hole transport layer on the surface of the semiconductor electrode. The resultant semiconductor electrode/hole transport layer was washed with acetonitrile and dried.

The hole transport layer thus obtained was a polymer film that is insoluble to a solvent.

Then, the resultant semiconductor electrode/hole transport layer was immersed in an acetonitrile solution containing Li[(CF$_3$SO$_2$)$_2$N] in a ratio of $15 \times 10^{-3}$ (mol/l) and 4-tert-butylpyridine in a ratio of $50 \times 10^{-3}$ (mol/l) for 10 minutes.

Subsequently, the semiconductor electrode/hole transport layer was air-dried and 60 nm of gold was deposited by a vacuum deposition method to form a second electrode thereon to obtain a photoelectric conversion element SC-1.

Examples 2 to 24, Comparative Example 1

Preparation of Photoelectric Conversion Elements SC-2 to 25

Photoelectric conversion elements SC-2 to SC-25 were prepared in the same manner as in preparation of the photoelectric conversion element SC-1 in Example 1, except that the sensitizing dyes and/or the monomers described in Table 1 were used instead as the sensitizing dye and/or the monomer which forms the polymer constituting the solid hole transport layer. In these example, all polymers constituting the solid hole transport layer were synthesized by using the dimers (H2-1 to H2-7) of the monomers.

Comparative example 2

Preparation of Photoelectric Conversion Element SC-26

In preparation of the photoelectric conversion element SC-1 in Example 1, the compound (DR-1) described in Table 1 was used instead as the sensitizing dye. A solid hole transport layer was formed from a compound (HR-1) described in Table 1. That is, the layer was formed by spin coating. Photoelectric conversion element SC-26 was produced in the same manner as described in Example 1 except these.

Compounds DR-1, DR-2, and HR-1 in the following Table 1 are shown below.

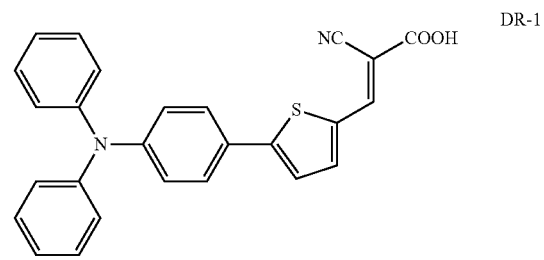

TBA (tetrabuthyl ammonium) =

$$\left[ \begin{array}{c} CH_2CH_2CH_2CH_3 \\ | \\ H_3CH_2CH_2CH_2C-N^+-CH_2CH_2CH_2CH_3 \\ | \\ CH_2CH_2CH_2CH_3 \end{array} \right]$$

-continued

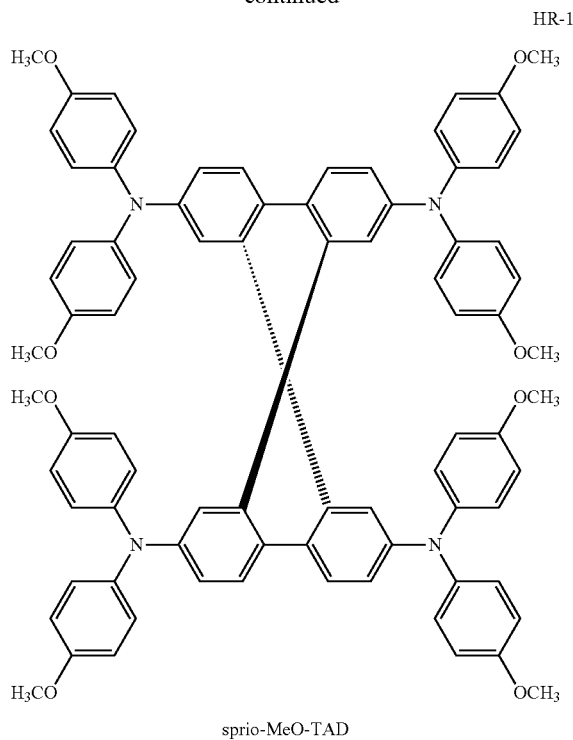

sprio-MeO-TAD

Evaluation of Photoelectric Conversion Elements

Photoelectric conversion characteristics were measured under the condition of irradiating with light having an intensity of 100 mW/cm² from a xenon lamp using a solar simulator (manufactured by EKO INSTRUMENTS Co., Ltd.) and covering an oxide semiconductor electrode (photoelectric conversion electrode) with a 5×5-mm² mask.

That is, for the photoelectric conversion elements SC-1 to 26, electric current-voltage was measured at room temperature using an I-V tester, to find short circuit electric current (Jsc), open circuit voltage (VoC), and form factor (F.F.), thereby obtaining photoelectric conversion efficiencies (η(%)). The conversion efficiency (η(%)) of the photoelectric conversion elements was calculated based on the following formula (A):

$$\eta = 100 \times (VoC \times Jsc \times F.F.)/P \quad \text{Formula (A):}$$

In the formula (A), P represents incident light intensity [mW/cm⁻²], Voc represents open circuit voltage [V], Jsc represents short circuit electric current density [mA·cm⁻²], and F.F. represents form factor.

(Measurement of Photoelectric Conversion Efficiency after Photodegradation Test)

The deterioration operation, where photoelectric conversion elements SC-1 to SC-20 were heated at 80° C. for 2 hours, followed by irradiation with light having an intensity of 100 mW/cm² from a xenon lamp for 120 minutes, was further performed. The photoelectric conversion efficiency (η(%)) after the deterioration operation was found.

Evaluation results of respective photoelectric conversion elements are shown in Table 1.

TABLE 1

| | | | | | | | Photoelectric conversion element | | |
| | | | | | | | Photoelectric conversion efficiency (η (%)) | | Photoelectric conversion |
| | | Sensitizing dye | Hole transport layer | Short circuit (mA·cm⁻²) | Release voltage (mV) | Form factors | Before degradation $n_2$ (%) | After degradation $n_1$ (%) | efficiency maintenance ratio $n_1/n_2$ (%) |
|---|---|---|---|---|---|---|---|---|---|
| Example 1 | SC-1 | D-1 | H2-1 | 4.9 | 840 | 0.59 | 2.43 | 1.37 | 56% |
| Example 2 | SC-2 | D-2 | H2-1 | 5.9 | 850 | 0.61 | 3.06 | 1.85 | 60% |
| Example 3 | SC-3 | D-3 | H2-1 | 8.1 | 901 | 0.62 | 4.52 | 2.87 | 63% |
| Example 4 | SC-4 | D-4 | H2-1 | 8 | 956 | 0.64 | 4.89 | 3.13 | 64% |
| Example 5 | SC-5 | D-5 | H2-1 | 8.5 | 934 | 0.62 | 4.92 | 3.21 | 65% |
| Example 6 | SC-6 | D-6 | H2-1 | 7.8 | 965 | 0.64 | 4.82 | 3.2 | 66% |
| Example 7 | SC-7 | D-7 | H2-1 | 8.2 | 952 | 0.62 | 4.84 | 3.42 | 71% |
| Example 8 | SC-8 | D-8 | H2-1 | 6.9 | 990 | 0.63 | 4.30 | 3.29 | 77% |
| Example 9 | SC-9 | D-9 | H2-1 | 7.4 | 960 | 0.62 | 4.40 | 3.40 | 77% |
| Example 10 | SC-10 | D-6 | H2-2 | 6.1 | 834 | 0.6 | 3.05 | 1.91 | 63% |
| Example 11 | SC-11 | D-6 | H2-3 | 7.02 | 841 | 0.63 | 2.72 | 2.51 | 67% |
| Example 12 | SC-12 | D-10 | H2-4 | 7.41 | 853 | 0.66 | 4.17 | 2.92 | 70% |
| Example 13 | SC-13 | D-10 | H2-5 | 7.55 | 810 | 0.61 | 3.73 | 2.76 | 74% |
| Example 14 | SC-14 | D-11 | H2-6 | 7.22 | 802 | 0.58 | 3.36 | 2.22 | 66% |
| Example 15 | SC-15 | D-10 | H2-7 | 7.38 | 868 | 0.62 | 4.24 | 3.19 | 75% |
| Example 16 | SC-16 | D-12 | H2-1 | 8.96 | 920 | 0.6 | 4.95 | 3.33 | 67% |
| Example 17 | SC-17 | D-13 | H2-1 | 9.2 | 910 | 0.59 | 4.94 | 3.58 | 72% |
| Example 18 | SC-18 | D-14 | H2-1 | 8.85 | 940 | 0.61 | 5.07 | 3.7 | 73% |
| Example 19 | SC-19 | D-15 | H2-1 | 8.99 | 907 | 0.65 | 5.3 | 3.85 | 73% |
| Example 20 | SC-20 | D-16 | H2-1 | 9.01 | 910 | 0.6 | 4.92 | 3.53 | 72% |
| Example 21 | SC-21 | D-17 | H2-1 | 8.95 | 920 | 0.65 | 5.35 | 3.9 | 73% |
| Example 22 | SC-22 | D-18 | H2-1 | 7.8 | 961 | 0.64 | 4.89 | 3.13 | 64% |
| Example 23 | SC-23 | D-20 | H2-1 | 8.23 | 920 | 0.7 | 5.3 | 3.78 | 71% |
| Example 24 | SC-24 | D-21 | H2-1 | 8.79 | 930 | 0.66 | 5.4 | 3.87 | 72% |
| Comparative Example 1 | SC-25 | DR-1 | H2-2 | 2.21 | 820 | 0.57 | 1.03 | 0.3 | 29% |
| Comparative Example 2 | SC-26 | DR-2 | HR-1 | 1.46 | 460 | 0.46 | 0.31 | 0.06 | 19% |

It is shown from Table 1 that the photoelectric conversion elements (SC-1 to SC-24) of the present invention having the solid hole transport layer comprising the polymer according to the present invention and the sensitizing dye according to the present invention have high photoelectric conversion efficiency and also are excellent in stability thereof.

On the other hand, the photoelectric conversion elements (SC-25, SC-26) of comparative examples including the sensitizing dye and/or the hole transport layer that are not involved in the scope of the present invention have lower photoelectric conversion efficiency and also more inferior stability than photoelectric conversion elements in examples (SC-1 to SC-24). Particularly, in Comparative example 1 in which a mono-type dye DR-1 containing a sensitizing dye having only one acidic group was used, even if the hole transport layer formed from the polymer according to the present invention was used, the desorption of the dye was caused by applying thermal energy, resulting in deterioration in durability.

On the other hand, since the sensitizing dye according to the present invention is a di-type dye having two acidic groups, adsorbability of the whole dye is improved. Even if thermal energy is applied, desorption of the dye can be prevented and thus durability can be improved. Particularly, photoelectric conversion elements (SC-2 to SC-24) having a thiophene-linking group (ring $b^1$) exhibited more excellent photoelectric conversion efficiency and durability than the photoelectric conversion element (SC-1) not having the thiophene-linking group. Further, it is found that the aggregation of the dye compound is prevented by using sensitizing dyes (SC-3 to SC-5, SC-20, SC-21, SC-23, and SC-24) wherein $R^1$ or $R^2$ has a linear alkyl group having 6 to 18 carbon atoms and thus photoelectric conversion characteristics can be improved. When sensitizing dyes (SC-7 to SC-9, SC-12, SC-13, SC-15, SC-17, SC-18, and SC-19) represented by the general formula (3) were used, it was confirmed that the planarity of the dye compound was improved, and thus the more excellent photoelectric conversion efficiency and durability were exhibited. When the sensitizing dye having an adsorption group Z with an amide bond is used (SC-8 and SC-9), it is found that adsorbability is improved by the amide bond, and, thus particularly excellent durability is exhibited.

According to the above results, it can be presumed that by combined effects by a solid hole transport layer comprising the polymer according to the present invention and a sensitizing dye that is a di-type dye according to the present invention, adsorbability of the sensitizing dye is improved and thus the desorption of the dye is prevented, which lead to improvement in durability of the photoelectric conversion element.

What is claimed is:

1. A photoelectric conversion element comprising a first electrode, a photoelectric conversion layer comprising a semiconductor and a sensitizing dye, and a solid hole transport layer, and a second electrode, on a substrate, wherein said sensitizing dye is represented by the following general formula (1):

General formula (1)

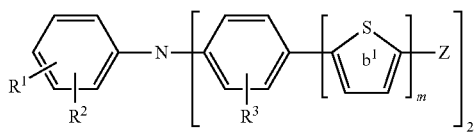

wherein $R^1$ and $R^2$ each independently represent a hydrogen atom, a linear or branched alkyl group having 1 to 24 carbon atoms in which at least one of hydrogen can be substituted by a substituent, and an alkenyl group having 2 to 32 carbon atoms, in which at least one of hydrogen can be substituted by a substituent, $R^3$ represents a hydrogen atom, at least one of the hydrogen atoms in the ring $b^1$ may be substituted by a substituent, provided that a plurality of substituents may bond with each other to form a ring which may have a substituent, or a plurality of the rings $b^1$ may be fused;

Z represents an organic residue having an acidic group, and an electron-attracting group or an electron-attracting ring structure;

m is an integer from 3 to 4, and each ring may each independently have a substituent;

said solid hole transport layer comprises a polymer obtainable by polymerizing a compound represented by the following formula or a multimer of one of the following formula:

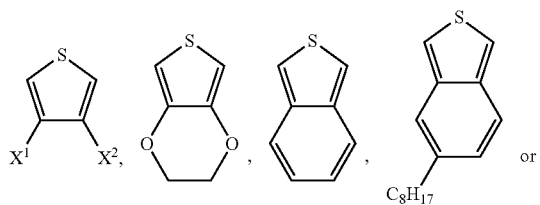

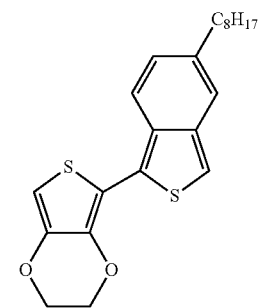

wherein $X^1$ and $X^2$ each independently represent a hydrogen atom, a linear or branched alkyl group having 6 to 18 carbon atoms, or —$OR^4$ group, $R^4$ represents a linear or branched alkyl group having 1 to 5 carbon atoms.

2. The photoelectric conversion element according to claim 1, wherein, in the general formula (1), $R^1$ and $R^2$ each independently represent an alkyl group having 2 to 24 carbon atoms, an alkenyl group having 2 to 32 carbon atoms.

3. The photoelectric conversion element according to claim 1, wherein, in the general formula (1), at least one ring $b^1$ has a linear alkyl group having 6 to 24 carbon atoms as a substituent.

4. A photoelectric conversion element comprising a first electrode, a photoelectric conversion layer comprising a semiconductor and a sensitizing dye, and a solid hole transport layer, and a second electrode, on a substrate, wherein the sensitizing dye is represented by the following general formula (3):

General formula (3):

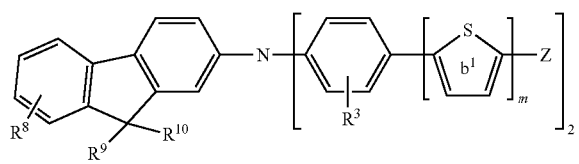

wherein
$R^3$ represents a hydrogen atom;
at least one of the hydrogen atoms in the ring $b^1$ may be substituted by a substituent, provided that a plurality of substituents may bond with each other to form a ring which may have a substituent, or a plurality of the rings may be fused;
Z represents an organic residue having an acidic group, and an electron-attracting group or an electron-attracting ring structure;
m is an integer from 0 to 4, and when m is 2 or more, each ring may each independently have a substituent;
$R^8$ represents a hydrogen atom, a linear or branched alkyl group having 1 to 24 carbon atoms, in which at least one of hydrogen can be substituted by a substituent an alkoxy group having 1 to 18 carbon atoms in which at least one of hydrogen can be substituted by a substituent; and
$R^9$ and $R^{10}$ each independently represent, a linear or branched alkyl group having 1 to 24 carbon atoms in which at least one of hydrogen can be substituted by a substituent,
said solid hole transport layer comprises a polymer obtainable by polymerizing a compound represented by the following formula or a multimer of one of the following formula:

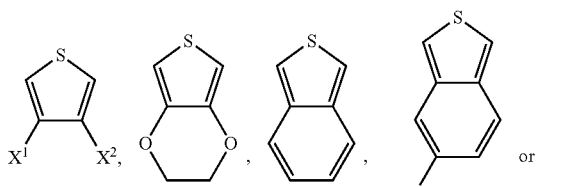

wherein $X^1$ and $X^2$ each independently represent a hydrogen atom, a linear or branched alkyl group having 6 to 18 carbon atoms, or —$OR^4$ group, $R^4$ represents a linear or branched alkyl group having 1 to 5 carbon atoms.

5. The photoelectric conversion element according to claim 4, wherein, in the general formula (3), $R^8$ is a linear alkyl group having 6 to 24 carbon atoms or an alkoxy group having 6 to 18 carbon atoms.

6. The photoelectric conversion element according to claim 1, wherein Z in the general formula (1) has the following structure:

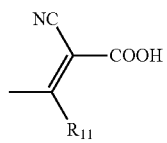

wherein $R^{11}$ is a hydrogen atom, a halogen atom, a linear or branched alkyl group having 1 to 24 carbon atoms, an aryl group having 6 to 24 carbon atoms, an aralkyl group having 7 to 24 carbon atoms, an alkoxy group having 1 to 18 carbon atoms or a cyano group.

7. The photoelectric conversion element according to claim 4, wherein Z in the general formula (3) has the following structure:

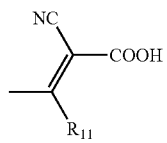

wherein $R^{11}$ is a hydrogen atom, a halogen atom, a linear or branched alkyl group having 1 to 24 carbon atoms, an aryl group having 6 to 24 carbon atoms, an aralkyl group having 7 to 24 carbon atoms, an alkoxy group having 1 to 18 carbon atoms or a cyano group.

8. The photoelectric conversion element according to claim 1, wherein Z in the general formula (1) has the following structure:

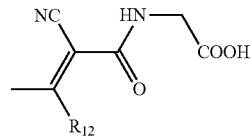

wherein $R^{12}$ is a hydrogen atom, a halogen atom, a linear or branched alkyl group having 1 to 24 carbon atoms, an aryl group having 6 to 24 carbon atoms, an aralkyl group having 7 to 24 carbon atoms, an alkoxy group having 1 to 18 carbon atoms or a cyano group.

9. The photoelectric conversion element according to claim 4, wherein Z in the general formula (3) has the following structure:

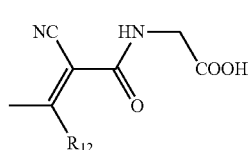

wherein $R^{12}$ is a hydrogen atom, a halogen atom, a linear or branched alkyl group having 1 to 24 carbon atoms, an aryl group having 6 to 24 carbon atoms, an aralkyl group having 7 to 24 carbon atoms, an alkoxy group having 1 to 18 carbon atoms or a cyano group.

10. A solar cell, comprising the photoelectric conversion element according to claim 1.

11. A solar cell, comprising the photoelectric conversion element according to claim 4.

12. A photoelectric conversion element comprising a first electrode, a photoelectric conversion layer comprising a semiconductor and a sensitizing dye, and a solid hole transport layer, and a second, electrode, on a substrate, wherein said sensitizing dye is represented by the following general formula (1)

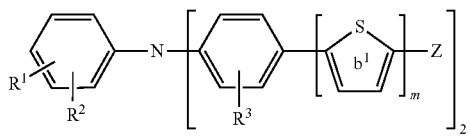

General formula (1)

wherein $R^1$ and $R^2$ each independently represent a hydrogen atom, a halogen atom, an aromatic residue, a linear or branched hydrocarbon group having 1 to 32 carbon atoms, an alkenyl group having 2 to 32 carbon atoms, an alkynyl group having 2 to 32 carbon atoms, an alkoxy group having 1 to 32 carbon atoms or an alkylthio group having 1 to 32 carbon atoms, provided that $R^1$ and $R^2$ may bond with each other to form a ring structure;

$R^3$ represents a hydrogen atom, a halogen atom, a linear or branched alkyl group having 1 to 24 carbon atoms, an aryl group having 6 to 24 carbon atoms or an aralkyl group having 7 to 24 carbon atoms;

at least one of the hydrogen atoms in the ring $b^1$ may be substituted by a substituent, provided that a plurality of substituents may bond with each other to form a ring which may have a substituent, or a plurality of the rings $b^1$ may be fused;

Z represents an organic residue having an acidic group, and an electron-attracting group or an electron-attracting ring structure;

m is an integer from 0 to 4, and when m is 2 or more, each ring may each independently have a substituent;

said solid hole transport layer comprises a polymer obtainable by polymerizing a compound represented by the following general formula (2) or a multimer of the compound:

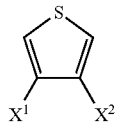

General formula (2)

wherein $X^1$ and $X^2$ each independently represent a hydrogen atom, a linear or branched alkyl group having 1 to 24 carbon atoms, an aryl group having 6 to 24 carbon atoms, —$OR^4$ group, —$SR^5$ group, —$SeR^6$ group or —$TeR^7$ group, $R^4$ to $R^7$ each independently represent a hydrogen atom or a linear or branched alkyl group having 1 to 24 carbon atoms, provided that $X^1$ and $X^2$ may bond with each other to form a ring structure, wherein Z in the general formula (1) has the following structure

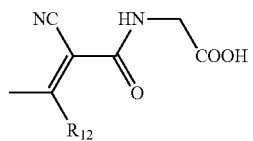

wherein $R^{12}$ is a hydrogen atom, a halogen atom, a linear or branched alkyl group having 1 to 24 carbon atoms, an aryl group having 6 to 24 carbon atoms, an aralkyl group having 7 to 24 carbon atoms, an alkoxy group having 1 to 18 carbon atoms or a cyano group.

13. The photoelectric conversion element according to claim 12, wherein, in the general formula (1), $R^1$ and $R^2$ each independently represent an alkyl group having 2 to 24 carbon atoms, an aryl group having 6 to 24 carbon atoms, an alkoxy group having 1 to 32 carbon atoms, an alkenyl group having 2 to 32 carbon atoms, provided that, $R^1$ and $R^2$ may bond with each other to form a ring structure.

14. The photoelectric conversion element according to claim 12, wherein, in the general formula (1), m is 2 to 4.

15. The photoelectric conversion element according to claim 12, wherein, in the general formula (1), at least one ring $b^1$ has a linear alkyl group having 6 to 24 carbon atoms as a substituent.

* * * * *